United States Patent
Chen et al.

(10) Patent No.: US 12,439,662 B2
(45) Date of Patent: Oct. 7, 2025

(54) DIFFUSION BARRIER LAYER FOR SOURCE AND DRAIN STRUCTURES TO INCREASE TRANSISTOR PERFORMANCE

(71) Applicant: Taiwan Semiconductor Manufacturing Company, Ltd., Hsin-Chu (TW)

(72) Inventors: Kuei-Ming Chen, New Taipei (TW); Chi-Ming Chen, Zhubei (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/437,321

(22) Filed: Feb. 9, 2024

(65) Prior Publication Data

US 2024/0243174 A1     Jul. 18, 2024

Related U.S. Application Data

(60) Continuation of application No. 17/869,874, filed on Jul. 21, 2022, now Pat. No. 11,901,413, which is a
(Continued)

(51) Int. Cl.
*H10D 62/13*     (2025.01)
*B82Y 10/00*     (2011.01)
(Continued)

(52) U.S. Cl.
CPC ......... *H10D 62/151* (2025.01); *H10D 30/027* (2025.01); *H10D 62/834* (2025.01);
(Continued)

(58) Field of Classification Search
CPC ......... H01L 29/78618; H01L 29/41783; H01L 29/165; H01L 29/0847; H01L 29/78;
(Continued)

(56) References Cited

U.S. PATENT DOCUMENTS 10,164,099 B2    12/2018  Pandey et al.
2008/0121992 A1*  5/2008  Yi ................. H10D 84/0167
                                                      257/E21.632
(Continued)

FOREIGN PATENT DOCUMENTS

CN          108666219 A     10/2018

OTHER PUBLICATIONS

Non-Final Office Action dated Apr. 22, 2022 for U.S. Appl. No. 17/064,811.

(Continued)

*Primary Examiner* — Sonya McCall-Shepard

(74) *Attorney, Agent, or Firm* — Eschweiler & Potashnik, LLC

(57) ABSTRACT

Various embodiments of the present disclosure are directed towards an integrated chip including a first transistor on a semiconductor substrate. The first transistor includes a first gate structure over the semiconductor substrate, a first pair of source/drain regions on opposing sides of the first gate structure, and a pair of diffusion barrier structures between the first pair of source/drain regions and a lower region of the semiconductor substrate. The first pair of source/drain regions comprise a first dopant. The diffusion barrier structures are co-doped with the first dopant and a second dopant different from the first dopant. A doping concentration of the first dopant within the first pair of source/drain regions is greater than a doping concentration of the first dopant within the diffusion barrier structures.

20 Claims, 19 Drawing Sheets

Related U.S. Application Data division of application No. 17/064,811, filed on Oct. 7, 2020, now Pat. No. 11,522,049.

(60) Provisional application No. 63/015,772, filed on Apr. 27, 2020.

(51) Int. Cl.
| | |
|---|---|
| *H01L 21/02* | (2006.01) |
| *H10D 30/01* | (2025.01) |
| *H10D 30/60* | (2025.01) |
| *H10D 30/67* | (2025.01) |
| *H10D 62/10* | (2025.01) |
| *H10D 62/17* | (2025.01) |
| *H10D 62/822* | (2025.01) |
| *H10D 62/834* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10D 84/83* | (2025.01) |
| *H10D 84/85* | (2025.01) |
| *H10D 86/00* | (2025.01) |
| *H10D 86/01* | (2025.01) |

(52) U.S. Cl.
CPC .......... *H10D 84/834* (2025.01); *H10D 86/01* (2025.01); *H10D 86/201* (2025.01); *H01L 21/02532* (2013.01); *H01L 21/02576* (2013.01); *H01L 21/02639* (2013.01); *H10D 64/259* (2025.01)

(58) Field of Classification Search
CPC .............. H01L 29/7834; H01L 27/092; H01L 29/66772; H01L 29/167; H01L 21/823814; H01L 29/78696; H01L 21/823412; H01L 29/66742; H01L 29/41733; H01L 29/786; H01L 29/78654; H01L 29/66628; H01L 29/66568; H01L 29/7848; H01L 29/1079; H01L 21/823418; H10D 62/151; H10D 30/027; H10D 30/60; H10D 84/85; H10D 62/364; H10D 62/834; H10D 84/834; H10D 30/43; H10D 30/6735; H10D 86/215; H10D 84/017; H10D 84/013

See application file for complete search history.

(56) References Cited

U.S. PATENT DOCUMENTS

| | | |
|---|---|---|
| 2011/0147828 A1 | 6/2011 | Murthy et al. |
| 2013/0062670 A1 | 3/2013 | Wong et al. |
| 2013/0087855 A1 | 4/2013 | Makiyama et al. |
| 2014/0170840 A1* | 6/2014 | Tsai ................. H10D 62/834 438/492 |
| 2014/0203361 A1 | 7/2014 | Adam et al. |
| 2016/0056290 A1 | 2/2016 | Tsai et al. |
| 2018/0175198 A1 | 6/2018 | Pandey et al. |
| 2018/0337234 A1 | 11/2018 | Zhao |
| 2019/0081044 A1 | 3/2019 | Avci et al. |
| 2019/0164747 A1 | 5/2019 | Chang et al. |
| 2019/0348500 A1 | 11/2019 | Glass et al. |
| 2020/0020774 A1 | 1/2020 | Lee et al. |
| 2020/0105934 A1 | 4/2020 | Ma et al. |

OTHER PUBLICATIONS

Notice of Allowance dated Aug. 4, 2022 for U.S. Appl. No. 17/064,811.

Non-Final Office Action dated Jun. 22, 2023 for U.S. Appl. No. 17/869,874.

Notice of Allowance dated Oct. 6, 2023 for U.S. Appl. No. 17/869,874.

* cited by examiner

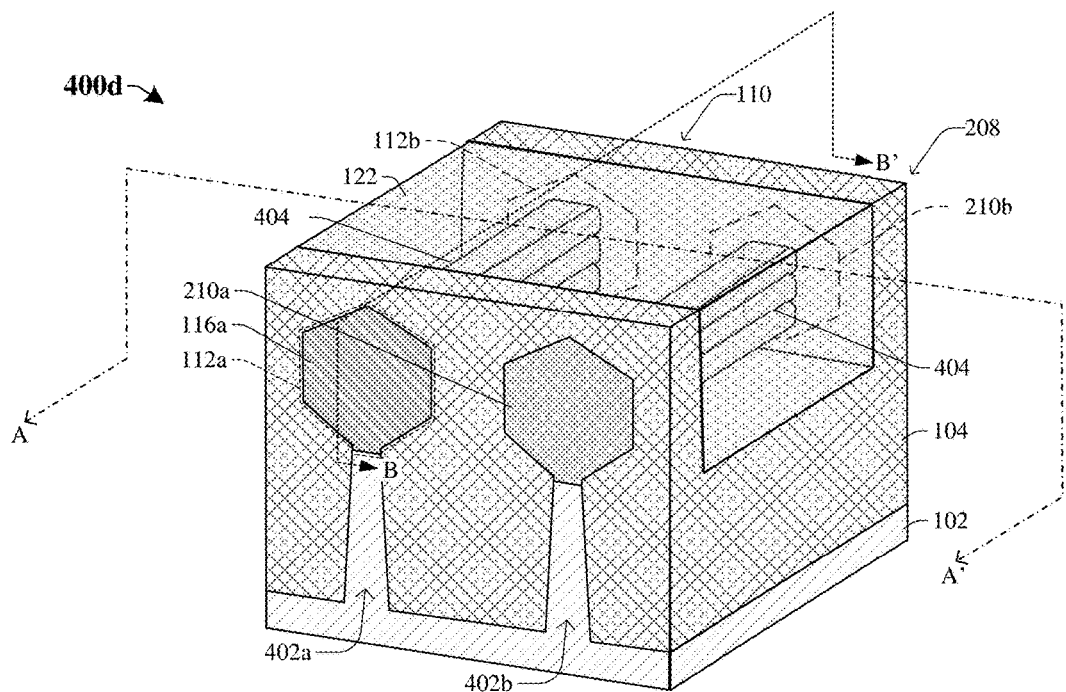
Fig. 4D
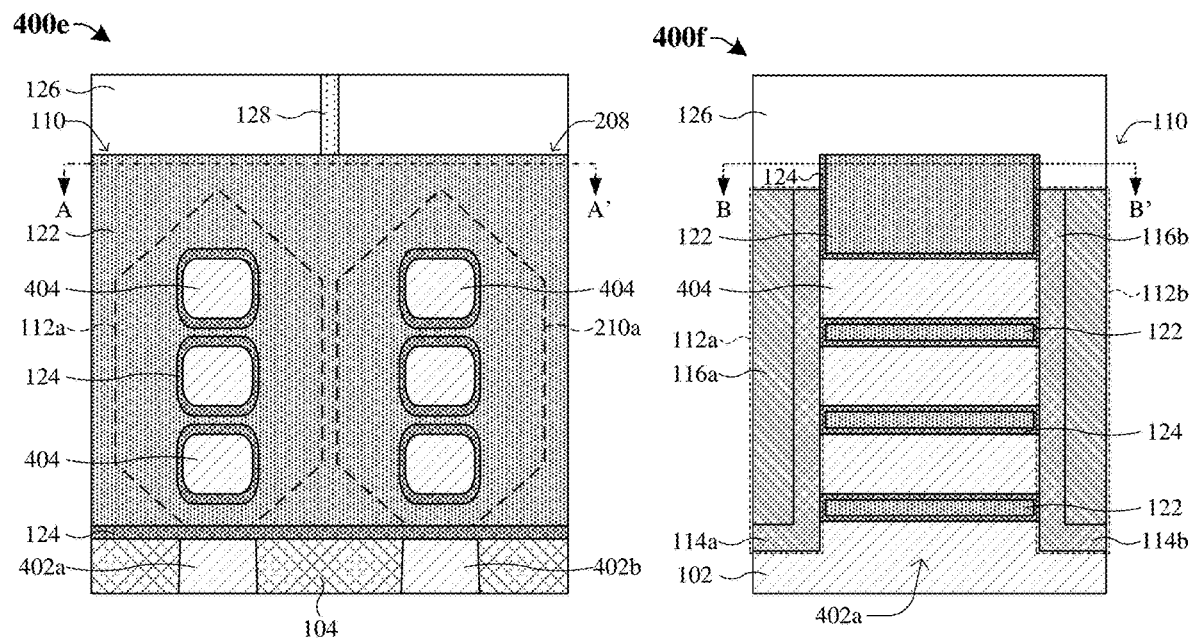
Fig. 4E  Fig. 4F

DIFFUSION BARRIER LAYER FOR SOURCE AND DRAIN STRUCTURES TO INCREASE TRANSISTOR PERFORMANCE

REFERENCE TO RELATED APPLICATIONS

This Application is a Continuation of U.S. application Ser. No. 17/869,874, filed on Jul. 21, 2022, which is a Divisional of U.S. application Ser. No. 17/064,811, filed on Oct. 7, 2020 (now U.S. Pat. No. 11,522,049, issued on Dec. 6, 2022), which claims the benefit of U.S. Provisional Application No. 63/015,772, filed on Apr. 27, 2020. The contents of the above-referenced Patent Applications are hereby incorporated by reference in their entirety.

BACKGROUND

Modern day integrated chips use a wide range of devices to achieve varying functionalities. In general, integrated chips comprise active devices and passive devices. Active devices include transistors such as metal oxide semiconductor field effect transistors (MOSFETs). MOSFET devices are employed in applications such as automobile electrical systems, power supplies, and power management applications based on the switching speed of the MOSFET devices. Switching speed is based, at least in part, on the RDS(on) of the MOSFET device. RDS(on) stands for "drain-source on resistance," or the total resistance between the drain and source in a MOSFET when the MOSFET is "on." RDS(on) is associated with current loss and is the basis for a maximum current rating of the MOSFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4F illustrate various views of some different alternative embodiments of the integrated chip of FIG. 2A.

DETAILED DESCRIPTION

Figure 1:
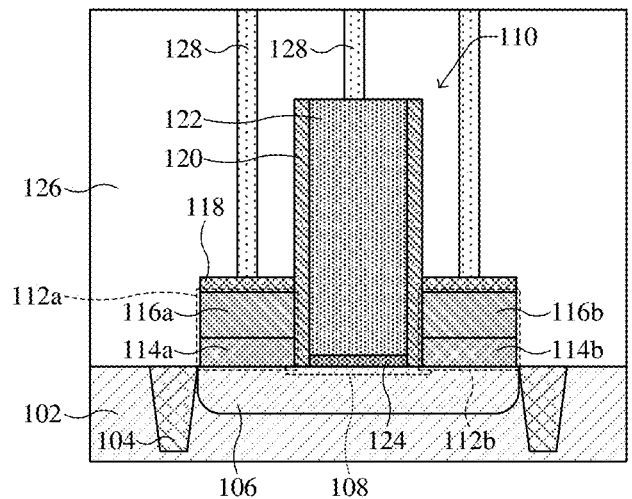
FIG. 1 illustrates a cross-sectional view of some embodiments of an integrated chip comprising diffusion barrier layers spaced between epitaxial source/drain layers and a substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Over the last two decades, transistors, such as metal-oxide-semiconductor field-effect transistors (MOSFETs), have used source and drain structures that are typically formed by implanting dopants in a substrate on opposing sides of a gate structure. In recent years, transistors having epitaxial source and drain structures have begun to see widespread use due to improved performance and scaling. A transistor includes a gate structure over a well region of the substrate, and epitaxial source/drain layers disposed within/over the substrate on opposing sides of the gate structure. The epitaxial source/drain layers each comprise a first dopant having a first doping type (e.g., N-type). Further, the well region of the substrate has a second doping type (e.g., P-type) opposite the first doping type. The gate electrode includes a gate electrode overlying a gate dielectric layer. The transistor turns ON when a voltage is applied to the gate electrode that is equal to or greater than a threshold voltage of the transistor. When the transistor turns ON, the voltage applied to the gate electrode causes a selectively formable channel to form within the well region between the epitaxial source/drain layers. The selectively formable channel comprises mobile charge carriers that can flow between the epitaxial source/drain layers. To increase the switching speeds and increase a maximum current rating associated with the transistor, the RDS(on) can be reduced. There are many factors that influence the RDS(on), such as a channel area under the gate structure, a diffusion resistance in the epitaxial source/drain layers, a resistance of the epitaxial source/drain layers, and a contact resistance between overlying conductive contacts and the epitaxial source/drain layers.

In an effort to reduce the RDS(on) of the transistor, a doping concentration of the first dopant (e.g., phosphorus) within the epitaxial source/drain layers is relatively high (e.g., greater than or equal to $10^{21}$ atoms/cm$^3$). This may for example, reduce the resistance of the epitaxial source/drain layers and reduce the contact resistance between overlying conductive contacts and the epitaxial source/drain layers. However, as the doping concentration of the first dopant increases, a likelihood of the first dopant diffusing out of the epitaxial source/drain layers is increased. Thus, the relatively high doping concentration of the first dopant can result in the first dopant diffusing into the substrate. This decreases the doping concentration of the first dopant within the epitaxial source/drain layers, thereby increasing the resistance of the epitaxial source/drain layers and subsequently increasing the RDS(on) of the transistor. Further, diffusion of the first dopant may shift the threshold voltage of the transistor, this may decrease a uniformity of threshold voltages across an array of transistors that each comprise the epitaxial source/drain layers, thereby decreasing performance of the array of transistors.

Accordingly, the present disclosure relates to a transistor device comprising diffusion barrier layers disposed between epitaxial source/drain layers and a semiconductor substrate. For example, the transistor device includes a gate structure overlying a well region of the semiconductor substrate. Epitaxial source/drain layers are disposed within/over the semiconductor substrate on opposing sides of the gate structure. The epitaxial source/drain layers each comprise a first dopant (e.g., phosphorus, arsenic, etc.) having a first doping type (e.g., N-type), where a doping concentration of the first dopant is relatively high (e.g., greater than or equal to $1*10^{21}$ atoms/cm$^3$). Further, the diffusion barrier layers are disposed directly beneath each epitaxial source/drain layer, such that the diffusion barrier layers separate the epitaxial source/drain layers from the semiconductor substrate. The diffusion barrier layers each comprise a barrier dopant (e.g., carbon) that is configured to mitigate and/or block diffusion of the first dopant from the epitaxial source/drain layers to the semiconductor substrate (e.g., to the well region). By mitigating and/or blocking diffusion of the first dopant, the relatively high concentration of the epitaxial source/drain layers may be maintained, thereby decreasing a resistance of the epitaxial source/drain layers and decreasing the RDS(on) of the transistor device. Further, the transistor device may be part of an integrated chip comprising an array of transistors over/within the semiconductor substrate, by mitigating diffusion of the first dopant a uniformity of threshold voltages across the array may be maintained, thereby increasing a performance of the integrated chip.

FIG. 1 illustrates a cross-sectional view of some embodiments of an integrated chip 100 comprising a first transistor 110 with a first pair of epitaxial source/drain layers 116a-b and a first pair of diffusion barrier layers 114a-b directly underlying the first pair of epitaxial source/drain layers 116a-b.

The integrated chip 100 includes a semiconductor substrate 102. The semiconductor substrate 102 has a first well region 106 disposed between sidewalls of an isolation structure 104.

In some embodiments, the semiconductor substrate 102 may be or comprise a semiconductor wafer (e.g., a silicon wafer), a silicon-on-insulator (SOI) substrate, intrinsic monocrystalline silicon, another suitable substrate, or the like. The isolation structure 104 extends from a top surface of the semiconductor substrate 102 to a point below the top surface of the semiconductor substrate 102. The first transistor 110 comprises a gate electrode 122, a sidewall spacer structure 120, a gate dielectric layer 124, and a first pair of source/drain structures 112a-b that overlies the semiconductor substrate 102. The gate electrode 122 overlies the first well region 106, and the gate dielectric layer 124 is disposed between the gate electrode 122 and the semiconductor substrate 102. The sidewall spacer structure 120 laterally surrounds the gate electrode 122 and the gate dielectric layer 124. Further, the first pair of source/drain structures 112a-b are spaced on opposing sides of the gate electrode 122. In some embodiments, the first transistor 110 may be configured as a metal oxide semiconductor field effect transistor (MOSFET), a high voltage transistor, an n-channel metal oxide semiconductor (nMOS) transistor, a planar metal oxide semiconductor (MOS) transistor, a fin field-effect transistor (FinFET), a gate-all-around FET (GAAFET), or the like.

An inter-level dielectric (ILD) layer 126 overlies the semiconductor substrate 102 and the first transistor 110. Further, a plurality of conductive contacts 128 are disposed within the ILD layer 126 and overlie the gate electrode 122 and the first pair of source/drain structures 112a-b. Silicide layers 118 overlie the first pair of source/drain structures 112a-b, such that the silicide layers 118 are disposed vertically between the first pair of source/drain structures 112a-b and overlying conductive contacts 128. Further, the source/drain structures 112a-b comprise the first pair of epitaxial source/drain layers 116a-b and the diffusion barrier layers 114a-b. The diffusion barrier layers 114a-b are spaced vertically between the first pair of epitaxial source/drain layers 116a-b and the semiconductor substrate 102.

The first pair of source/drain structures 112a-b comprise a first source/drain structure 112a that can be configured as a source structure for the first transistor 110, and a second source/drain structure 112b that can be configured as a drain structure for the first transistor 110, or vice versa. Further, the first pair of epitaxial source/drain layers 116a-b comprise a first epitaxial source/drain layer 116a and a second epitaxial source/drain layer 116b. In an embodiment, the first epitaxial source/drain layer 116a can be configured as a source of the first transistor 110, and the second epitaxial source/drain layer 116b can be configured as a drain of the first transistor 110, or vice versa. In addition, the diffusion barrier layers 114a-b comprise a first diffusion barrier layer 114a and a second diffusion barrier layer 114b. The first diffusion barrier layer 114a is disposed between the semiconductor substrate 102 and the first epitaxial source/drain layer 116a, and the second diffusion barrier layer 114b is disposed between the semiconductor substrate 102 and the second epitaxial source/drain layer 116b.

In some embodiments, the diffusion barrier layers 114a-b may be epitaxially grown over the semiconductor substrate 102, such that the first and second diffusion barrier layers 114a, 114b may each be referred to as an epitaxial diffusion barrier layer. During operation of the first transistor 110, by applying suitable biasing conditions to the gate electrode 122 and the first pair of source/drain structures 112a-b, a selectively-conductive channel can be formed within a channel region 108 of the first well region 106. In such embodiments, charge carriers may flow within the channel region 108 between the first pair of source/drain structures 112a-b.

In some embodiments, the first and second epitaxial source/drain layers 116a, 116b each comprise a first dopant having a first doping type (e.g., N-type) and may have a doping concentration ranging between about $10^{19}$ to $4*10^{21}$ atoms/cm$^3$. In some embodiments, the first well region 106 comprises a second doping type (e.g., P-type) and may have a doping concentration ranging between about $10^{15}$ to $10^{17}$ atoms/cm$^3$. In various embodiments, the first doping type is opposite the second doping type. In further embodiments, the diffusion barrier layers 114a-b each comprise the first dopant having the first doping type (e.g., N-type) and may have a first doping concentration of the first dopant ranging between about $10^{19}$ to $4*10^{21}$ atoms/cm$^3$. Further, the diffusion barrier layers 114a-b each comprise a barrier dopant (e.g., carbon (C)) and may have a second doping concentration of the barrier dopant ranging between about $10^{19}$ to $3*10^{21}$ atoms/cm$^3$. In some embodiments, the barrier dopant may be referred to as a diffusion barrier species. The first dopant may for example, be or comprise phosphorus, arsenic, another suitable N-type dopant, or any combination of the foregoing. The barrier dopant may for example, be or comprise carbon (C), but other barrier dopants are amenable. Thus, in some embodiments, the barrier dopant is different from the first dopant.

In order to reduce a resistance (e.g., a sheet resistance) of the first pair of epitaxial source/drain layers 116a-b, the doping concentration of the first dopant within the first and second epitaxial source/drain layers 116a, 116b is relatively high (e.g., greater than about $1*10^{21}$ atoms/cm$^3$). As the doping concentration of the first dopant is increased, a likelihood of the first dopant diffusing out of the first pair of epitaxial source/drain layers 116a-b to the semiconductor substrate 102 (e.g., to the first well region 106) is increased. For example, if the first dopant comprises phosphorus and the doping concentration is relatively high (e.g., greater than about $1*10^{21}$ atoms/cm$^3$), then the first dopant may be prone to diffusing out of the first pair of epitaxial source/drain layers 116a-b. Further, the barrier dopant (e.g., carbon) is configured to mitigate or block diffusion of the first dopant (e.g., phosphorus, arsenic, etc.). For example, the barrier dopant can act as a substitutional atom and replaces silicon atoms throughout the lattice of the diffusion barrier layers 114a-b, thereby mitigating diffusion of the first dopant across the lattice of the diffusion barrier layers 114a-b and/or the first pair of epitaxial source/drain layers 116a-b. Thus, by virtue of the diffusion barrier layers 114a-b being disposed between the first pair of epitaxial source/drain layers 116a-b and the semiconductor substrate 102 and by comprising the barrier dopant, the diffusion barrier layers 114a-b mitigate diffusion of the first dopant from the first pair of epitaxial source/drain layers 116a-b to the semiconductor substrate 102. This facilitates maintaining the relatively high doping concentration of the first dopant within the first pair of epitaxial source/drain layers 116a-b, thereby maintaining a reduced resistance (e.g., a reduced sheet resistance) of the first pair of epitaxial source/drain layers 116a-b. Further, mitigating diffusion of the first dopant has the effect of reducing the RDS(on) of the first transistor 110. Advantageously, the lower RDS(on) facilities current flow in the first transistor 110, thereby increasing switching speed and increasing a maximum current rating of the first transistor 110. In addition, mitigating diffusion of the first dopant to the semiconductor substrate 102 mitigates and/or prevents a shift in a threshold voltage of the first transistor 110, thereby further increasing performance of the first transistor 110.

Figure 2A:
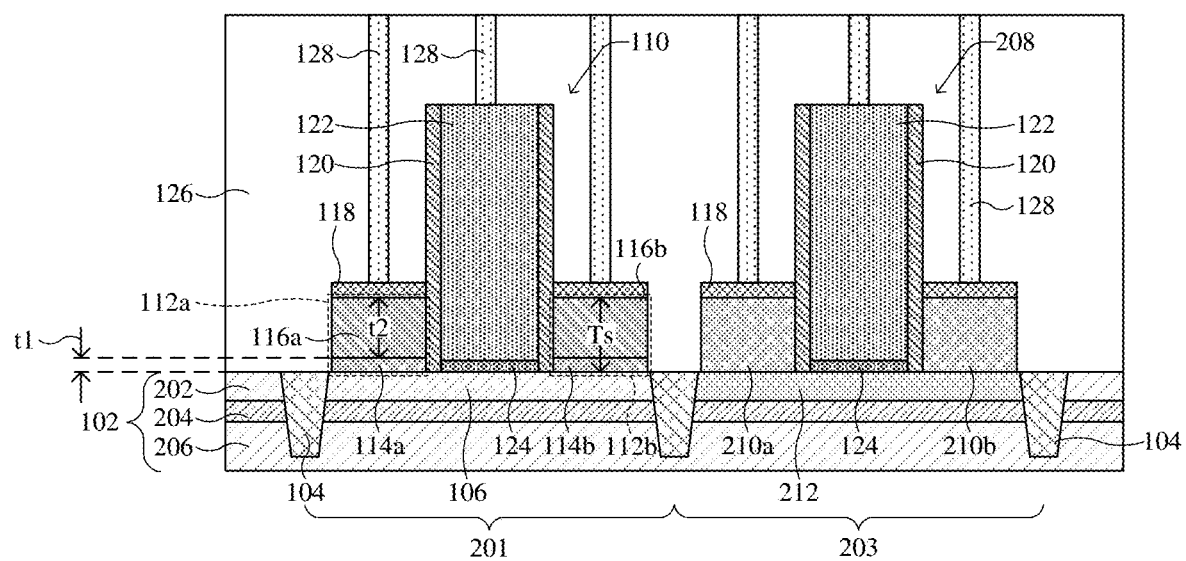
FIGS. 2A-2E illustrates cross-sectional views of some different embodiments of an integrated chip comprising a first transistor and a second transistor disposed within/over a substrate, where the first transistor comprises diffusion barrier layers disposed between the substrate and epitaxial source/drain layers of the first transistor.

FIG. 2A illustrates a cross-sectional view of some embodiments of an integrated chip 200 comprising a first transistor 110 disposed laterally adjacent to a second transistor 208.

The integrated chip 200 includes a semiconductor substrate 102 having an N-type metal oxide semiconductor (NMOS) region 201 laterally adjacent to and a P-type metal oxide semiconductor (PMOS) region 203. The semiconductor substrate 102 includes a first semiconductor material layer 202, an insulating layer 204, and a second semiconductor material layer 206. In various embodiments, the semiconductor substrate 102 is a semiconductor-on-insulator (SOI) substrate, a partially-depleted semiconductor-on-insulator (PDSOI), a fully-depleted semiconductor-on-insulator (FDSOI), or another suitable semiconductor substrate. The first semiconductor material layer 202 may for example, be or comprise crystalline silicon, monocrystalline silicon, doped silicon, intrinsic silicon, some other silicon material, some other semiconductor material, or any combination of the foregoing. Further, the first semiconductor material layer 202 can have a face-center-cubic (fcc) structure with a [100] orientation. In an embodiment, the second semiconductor material layer 206 is or comprises crystalline silicon, monocrystalline silicon, doped silicon, intrinsic silicon, some other silicon material, some other semiconductor material, or any combination of the foregoing. In addition, the insulating layer 204 may for example, be or comprise a dielectric material, such as silicon dioxide, or another suitable material.

The first transistor 110 is disposed within the NMOS region 201 and the second transistor 208 is disposed within the PMOS region 203. In some embodiments, the first transistor 110 is configured as an NMOS transistor and the second transistor 208 is configured as a PMOS transistor. The first and second transistors 110, 208 respectively comprise a gate electrode 122, a sidewall spacer structure 120, and a gate dielectric layer 124. The gate electrode 122 may for example, be or comprise polysilicon, doped polysilicon, a metal material such as aluminum, copper, titanium, tantalum, tungsten, tungsten, another suitable material, or any combination of the foregoing. The sidewall spacer structure 120 may for example, be or comprise silicon nitride, silicon carbide, another dielectric material, or any combination of the foregoing. Further, the gate dielectric layer 124 may for example, be or comprise silicon dioxide, a high κ dielectric material, or the like. As used herein, a high κ dielectric material is a dielectric material with a dielectric constant greater than 3.9.

The isolation structure 104 is disposed within the semiconductor substrate 102 and may extend continuously from a top surface of the first semiconductor material layer 202, through the insulating layer 204, to the second semiconductor material layer 206. The isolation structure 104 is configured to demarcate device regions of the semiconductor substrate 102, such as the NMOS region 201 and the PMOS region 203. Further, the isolation structure 104 may be configured to provide electrical isolation between devices (e.g., the first transistor 110 and the second transistor 208) disposed within/over the semiconductor substrate 102. The isolation structure 104 may be configured as a shallow trench isolation (STI) structure, a deep trench isolation (DTI) structure, or the like, and for example, may comprise a dielectric material such as silicon dioxide, silicon nitride, silicon carbide, another suitable dielectric material, or any combination of the foregoing.

The first transistor 110 further comprises a first pair of source/drain structures 112a-b overlying the first semiconductor material layer 202 and spaced on opposing sides of the gate electrode 122 of the first transistor 110. In some embodiments, the first pair of source/drain structures 112a-b comprise the first pair of epitaxial source/drain layers 116a-b and the diffusion barrier layers 114a-b that are spaced between the first semiconductor material layer 202 and the first pair of epitaxial source/drain layers 116a-b. The second transistor 208 further comprises a second pair of epitaxial source/drain layers 210a-b overlying the first semiconductor material layer 202 and spaced on opposing sides of the gate electrode 122 of the second transistor 208. In some embodiments, the second pair of epitaxial source/drain layers 210a-b serve as a second pair of source/drain structures for the second transistor 208. Further, the gate electrode 122 of the second transistor 208 overlies a second well region 212 disposed within the first semiconductor material layer 202. The second well region 212 has a first doping type (e.g., N-type) and may have a doping concentration ranging between about $10^{15}$ to $10^{17}$ atoms/cm$^3$, or another suitable doping concentration value. The second pair of epitaxial source/drain layers 210a-b may for example, have a second doping type (e.g., P-type) with a doping concentration ranging between about $10^{19}$ to $4*10^{21}$ atoms/cm$^3$, or another suitable doping concentration value. In various embodiments, the second doping type is opposite the first doping type. Further, the second pair of epitaxial source/drain layers 210a-b are grown as epitaxial layers (e.g., epitaxial silicon) with P-type materials. In some embodiments, the second pair of epitaxial source/drain layers 210a-b comprise silicon germanium (SiGe), or another suitable material. In addition, the second pair of epitaxial source/drain layers 210a-b comprise a third epitaxial source/drain layer 210a and a fourth epitaxial source/drain layer 210b disposed on opposing sides of the gate electrode 122 of the second transistor 208. In some embodiments, the first semiconductor material layer 202 has the second doping type (e.g., P-type).

In addition, a silicide layer 118 overlies the first pair of epitaxial source/drain layers 116a-b and the second pair of epitaxial source/drain layers 210a-b. The silicide layer 118 may for example, be or comprise nickel silicide, titanium silicide, or another suitable material. The silicide layer 118 is configured to reduce a contact resistance between the first and second pairs of epitaxial source/drain layers 116a-b, 210a-b and overlying conductive contacts 128. The conductive contacts 128 are disposed within the ILD layer 126. The conductive contacts 128 may for example, be or comprise tungsten, aluminum, copper, titanium nitride, tantalum nitride, ruthenium, another conductive material, or any combination of the foregoing. Further, the ILD layer 126 may for example, be or comprise silicon dioxide, a low κ dielectric material, or the like. As used herein, a low κ dielectric material is a dielectric material with a dielectric constant less than 3.9.

In some embodiments, the first and second epitaxial source/drain layers 116a, 116b may for example, each comprise the first dopant having the first doping type (e.g., N-type) and may have a doping concentration of the first dopant that is about $3*10^{21}$ atoms/cm$^3$, within a range of about $10^{19}$ to $4*10^{21}$ atoms/cm$^3$, or another suitable doping concentration value. In further embodiments, the first dopant may be or comprise phosphorus, arsenic, another suitable N-type dopant, or any combination of the foregoing. It will be appreciated that the first dopant comprising another element is within the scope of the disclosure. Further, the first pair of epitaxial source/drain layers 116a-b are grown as epitaxial layers (e.g., epitaxial silicon) with N-type materials. For example, here the first pair of epitaxial source/drain layers 116a-b comprise an n-type semiconductor material including silicon and phosphorus, such as SiP. In yet further embodiments, an atomic percentage of the first dopant within the first pair of epitaxial source/drain layers 116a-b may be about 6 percent, within a range of about 0.2 to 8 percent, or another suitable percentage value. In some embodiments, the first and second epitaxial source/drain layers 116a, 116b may for example, each consist of or consist essentially of a compound of silicon and phosphorus, such as SiP; or a compound of silicon and arsenic, such as SiAs. It will be appreciated that the first and second epitaxial source/drain layers 116a, 116b comprising other compounds or elements is within the scope of the disclosure. In further embodiments, the first pair of epitaxial source/drain layers 116a-b have a face-center-cubic (fcc) structure with a [100] orientation.

In some embodiments, if the doping concentration of the first dopant within the first and second epitaxial source/drain layers 116a, 116b is substantially small (e.g., less than about $10^{19}$ atoms/cm$^3$), then a sheet resistance of the first and second epitaxial source/drain layers 116a, 116b is increased. In yet further embodiments, if the doping concentration of the first dopant within the first and second epitaxial source/drain layers 116a, 116b is substantially large (e.g., greater than about $4*10^{21}$ atoms/cm$^3$), then the first dopant may damage or distort the crystal lattice of the first and second epitaxial source/drain layers 116a, 116b, thereby decreasing a stability of the first and second epitaxial source/drain layers 116a, 116b.

In further embodiments, the diffusion barrier layers 114a-b each comprise the first dopant having the first doping type (e.g., N-type) and may have a first doping concentration of the first dopant that is about $1.2*10^{20}$ atoms/cm$^3$, about $1.2*10^{21}$ atoms/cm$^3$, within a range of about $10^{19}$ to $4*10^{21}$ atoms/cm$^3$, or another suitable doping concentration value. In some embodiments, the first doping concentration of the first dopant within the diffusion barrier layers 114a-b is less than the doping concentration of the first dopant within the first pair of epitaxial source/drain layers 116a-b. In various embodiments, a first atomic percentage of the first dopant within each of the diffusion barrier layers 114a-b may be about 2 percent, within a range of about 0.2 to 8 percent, or another suitable percentage value. In various embodiments, the first atomic percentage of the first dopant within the diffusion barrier layers 114a-b is less than the atomic percentage of the first dopant within the first pair of epitaxial source/drain layers 116a-b. Further, the diffusion barrier layers 114a-b comprise a barrier dopant (e.g. carbon) and may have a second doping concentration of the barrier dopant that is about $5.2*10^{20}$ atoms/cm$^3$, within a range of about $10^{19}$ to $3*10^{21}$ atoms/cm³, or another suitable doping concentration value. The barrier dopant may for example, be or comprise carbon (C), but other barrier dopants are amenable. Thus, in some embodiments, the barrier dopant is different from the first dopant. In various embodiments, a second atomic percentage of the barrier dopant within the diffusion barrier layers 114a-b may be about 1 percent, within a range of about 0.2 to 6 percent, or another suitable percentage value. Thus, in some embodiments, the second atomic percentage of the barrier dopant within the diffusion barrier layers 114a-b is less than the first atomic percentage of the first dopant within the diffusion barrier layers 114a-b. Further, the diffusion barrier layers 114a-b may for example, be grown as epitaxial layers (e.g., epitaxial silicon) with N-type materials and the barrier dopant. For example, the diffusion barrier layers 114a-b may comprise an n-type semiconductor material including silicon, phosphorus, and carbon, such as SiCP. In some embodiments, the diffusion barrier layers 114a-b may for example, each consist of or consist essentially of a compound of silicon, carbon, and phosphorus, such as SiCP; a compound of silicon carbon, and arsenic, such as SiCAs; a compound of silicon, carbon, and oxygen, such as SiCO; or silicon doped with carbon, such as SiC. It will be appreciated that the diffusion barrier layers 114a-b comprising other compounds or elements is within the scope of the disclosure. In further embodiments, the diffusion barrier layers 114a-b have a face-center-cubic (fcc) structure with a [100] orientation.

In some embodiments, if the first doping concentration of the first dopant within the diffusion barrier layers 114a-b is substantially small (e.g., less than about $10^{19}$ atoms/cm³), then a sheet resistance of the diffusion barrier layers 114a-b is increased. In yet further embodiments, if the first doping concentration of the first dopant within the diffusion barrier layers 114a-b is substantially large (e.g., greater than about $4*10^{21}$ atoms/cm³), then the first dopant may damage or distort the crystal lattice of the diffusion barrier layers 114a-b, thereby decreasing a stability of the diffusion barrier layers 114a-b. In yet further embodiments, if the second doping concentration of the barrier dopant within the diffusion barrier layers 114a-b is substantially small (e.g., less than about $10^{19}$ atoms/cm³), then an ability of the diffusion barrier layers 114a-b to mitigate and/or block diffusion of the first dopant is significantly reduced. In yet further embodiments, if the second doping concentration of the barrier dopant within the diffusion barrier layers 114a-b is substantially large (e.g., greater than about $3*10^{21}$ atoms/cm³), then the barrier dopant may damage or distort the crystal lattice of the diffusion barrier layers 114a-b, thereby decreasing a stability of the diffusion barrier layers 114a-b.

Further, the diffusion barrier layers 114a-b have a first thickness t1, the first pair of epitaxial source/drain layers 116a-b have a second thickness t2, and the first pair of source/drain structures 112a-b has a total thickness Ts. The total thickness Ts may be a sum of the first thickness t1 and the second thickness t2. The first thickness t1 is, for example, about 3 nanometers (nm), within a range of about 1 to 5 nm, or another suitable value. The second thickness t2 is, for example, about 15 nm, within a range of about 5 to 40 nm, or another suitable value. Thus, in some embodiments, the second thickness t2 of the first pair of epitaxial source/drain layers 116a-b is greater than the first thickness t1 of the diffusion barrier layers 114a-b. In yet further embodiments, the first thickness t1 is about 16.7% of the total thickness Ts (e.g., 0.167*Ts), within a range of about 1% to 50% of the total thickness Ts (e.g., 0.01*Ts to 0.50*Ts), or another suitable value. In various embodiments, the second thickness t2 is about 83.3% of the total thickness Ts (e.g., 0.833*Ts), within a range of about 50% to 99% of the total thickness Ts (e.g., 0.5*Ts to 0.99*Ts), or another suitable value.

In some embodiments, if the first thickness t1 is substantially small (e.g., less than about 1 nm), then an ability of the diffusion barrier layers 114a-b to mitigate and/or block diffusion of the first dopant is significantly reduced. In yet further embodiments, if the first thickness t1 is substantially large (e.g., greater than about 5 nm), then a sheet resistance of the diffusion barrier layers 114a-b is increased. In various embodiments, if the second thickness t2 is substantially small (e.g., less than about 5 nm), then a stability (e.g., a structural integrity) of the first pair of epitaxial source/drain layers 116a-b may be reduced. In further embodiments, if the second thickness t2 is substantially large (e.g., greater than about 40 nm), then a sheet resistance of the first pair of epitaxial source/drain layers 116a-b may be increased.

Figure 2B:
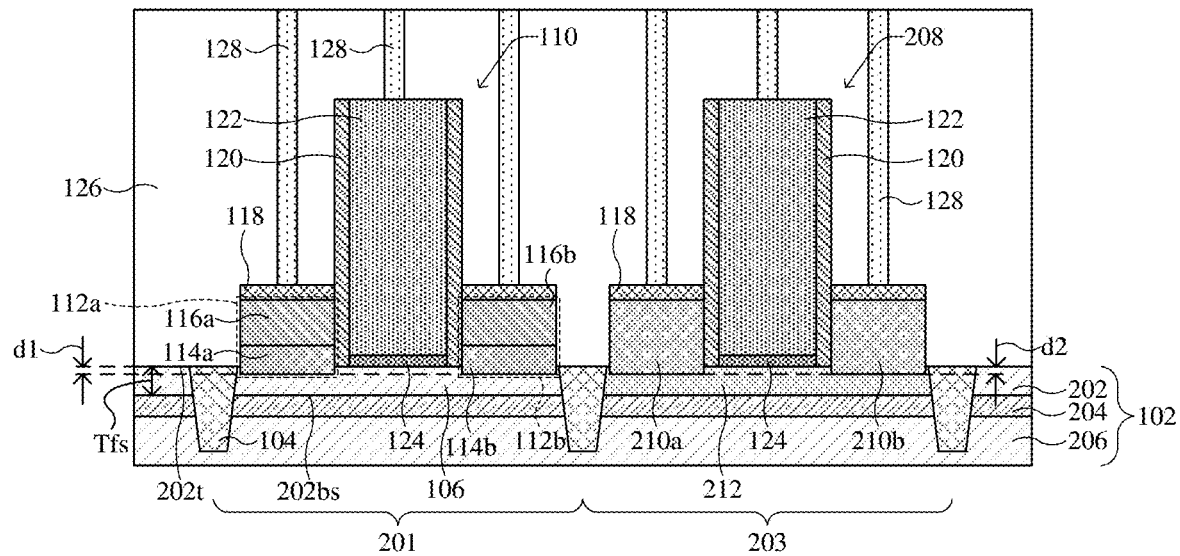

FIG. 2B illustrates a cross-sectional view of some alternative embodiments of the integrated chip 200 of FIG. 2A, in which a bottom surface of the diffusion barrier layers 114a-b is disposed below a top surface 202t of the first semiconductor material layer 202 by a first distance d1. Further, the second pair of epitaxial source/drain layers 210a-b is disposed below the top surface 202t of the first semiconductor material layer 202 by a second distance d2. In some embodiments, a channel region of the first transistor 110 is disposed laterally between the diffusion barrier layers 114a-b and a channel region of the second transistor 208 is disposed laterally between the second pair of epitaxial source/drain layers 210a-b. Further, a thickness Tfs of the first semiconductor material layer 202 is defined between the top surface 202t of the first semiconductor material layer 202 and a bottom surface 202bs of the first semiconductor material layer 202. The thickness Tfs of the first semiconductor material layer 202 may for example, be within a range of about 20 to 30 nm. In various embodiments, the first distance d1 and the second distance d2 are respectively within a range of about 5 to 29.5 nm, or another suitable value. In some embodiments, the first distance d1 is different from the second distance d2.

Figure 2C:
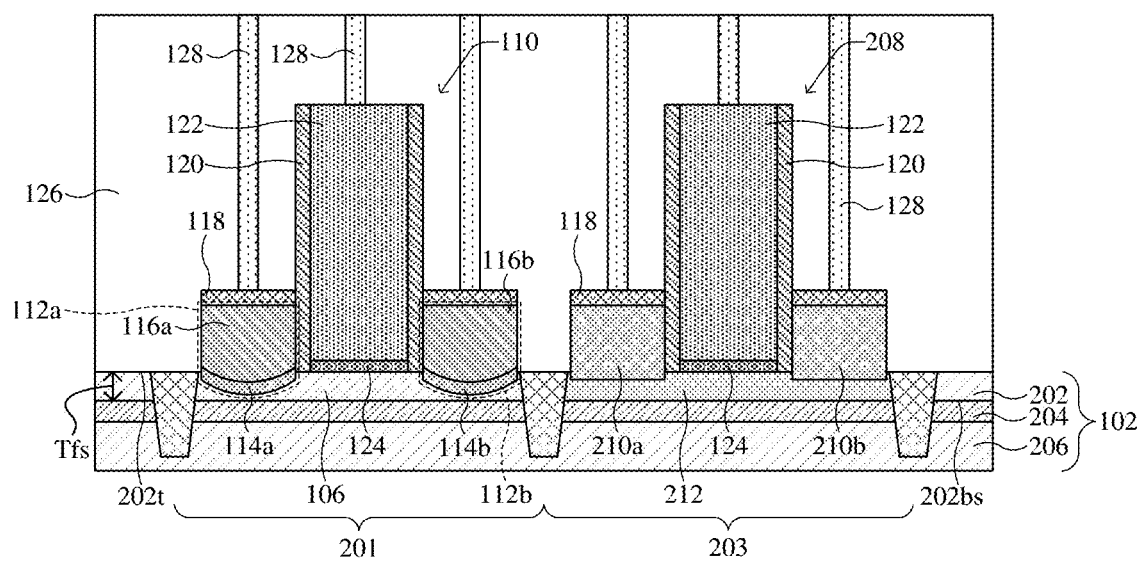

FIG. 2C illustrates a cross-sectional view of some alternative embodiments of the integrated chip 200 of FIG. 2A, in which a bottom surface of the diffusion barrier layers 114a-b is curved and a bottom surface of the pair of epitaxial source/drain layers 116a-b is curved. In various embodiments, the bottom surface of the pair of epitaxial source/drain layers 116a-b is disposed vertically below the top surface 202t of the first semiconductor material layer 202.

Figure 2D:
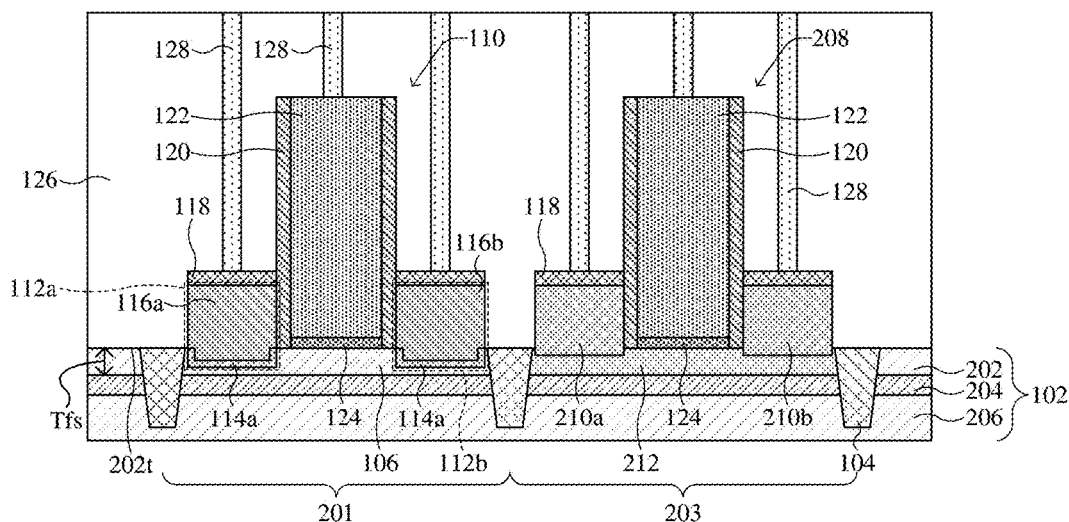

FIG. 2D illustrates a cross-sectional view of some alternative embodiments of the integrated chip 200 of FIG. 2A, in which the diffusion barrier layers 114a-b are each U-shaped and disposed within a cavity defined by sidewalls and an upper surface of the first semiconductor material layer 202.

Figure 2E:
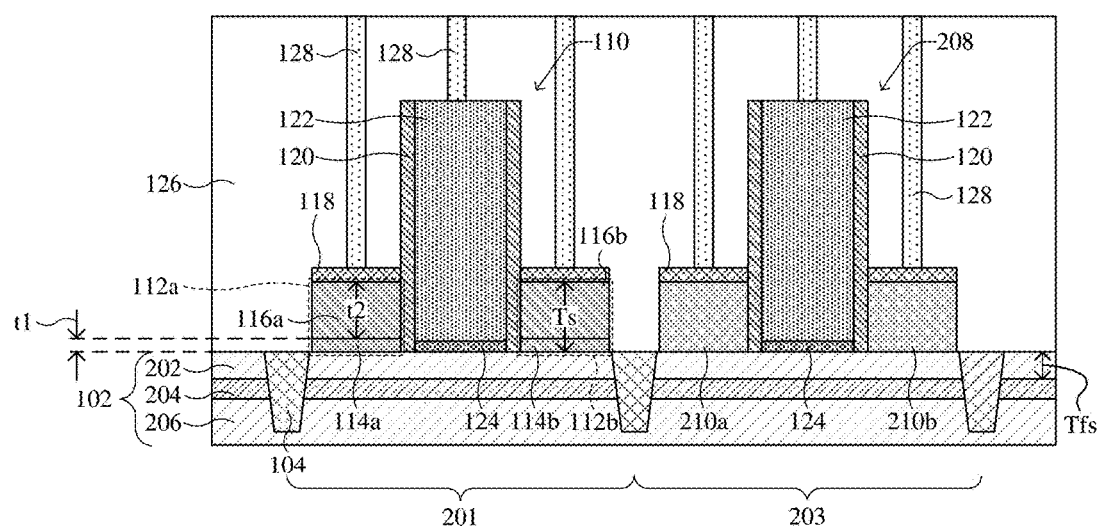

FIG. 2E illustrates a cross-sectional view of some alternative embodiments of the integrated chip 200 of FIG. 2A, in which the first well region (106 of FIG. 2A) and the second well region (212 of FIG. 2A) are omitted. In such embodiments, the thickness Tfs of the first semiconductor material layer 202 may be about 5 nm, within a range of about 0.5 to 15 nm, or another suitable thickness value. Further, the first semiconductor material layer 202 may for example, be or comprise intrinsic silicon, intrinsic monocrystalline silicon, another suitable material, or any combination of the foregoing.

Figure 3A:
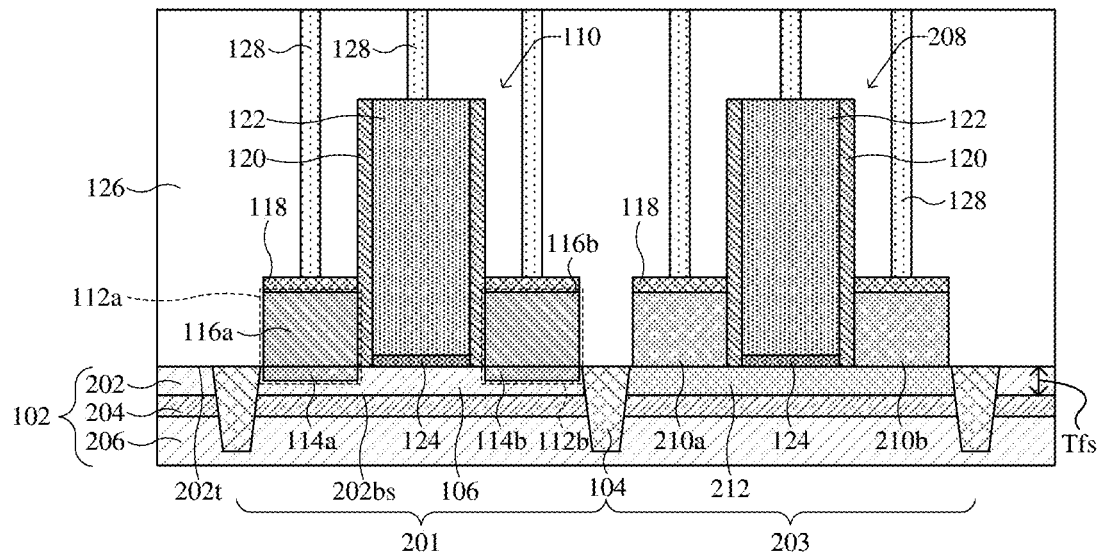
FIGS. 3A-3C illustrate cross-sectional views of some different embodiments of an integrated chip comprising diffusion barrier layers disposed within a substrate and epitaxial source/drain regions overlying the diffusion barrier layers.

FIG. 3A illustrates a cross-sectional view of some embodiments of an integrated chip 300 corresponding to some alternative embodiments of the integrated chip 200 of FIG. 2A in which the diffusion barrier layers 114a-b are or comprise doped regions of the first semiconductor material layer 202. In such embodiments, the diffusion barrier layers 114a-b may be referred to as diffusion barrier regions. The diffusion barrier layers 114a-b comprise the barrier dopant (e.g. carbon) and may for example, have a doping concentration of the barrier dopant that is about $5.2*10^{20}$ atoms/cm$^3$, within a range of about $10^{19}$ to $3*10^{21}$ atoms/cm$^3$, or another suitable doping concentration value. The barrier dopant may for example, be or comprise carbon (C), but other barrier dopants are amenable. In various embodiments, an atomic percentage of the barrier dopant within the diffusion barrier layers 114a-b may be about 1 percent, within a range of about 0.2 to 6 percent, or another suitable percentage value. In further embodiments, a top surface of the diffusion barrier layers 114a-b is aligned with the top surface 202t of the first semiconductor material layer 202, and a bottom surface of the diffusion barrier layers 114a-b is disposed at a point below the top surface 202t of the first semiconductor material layer 202. In further embodiments, the point is disposed above the bottom surface 202bs of the first semiconductor material layer 202. Further, in some embodiments, the diffusion barrier layers 114a-b are devoid of the first dopant (e.g., phosphorus and/or arsenic), such that the diffusion barrier layers 114 consist of or consist essentially of a material of the first semiconductor material layer 202 (e.g., silicon) and the barrier dopant (e.g., carbon), such as SiC. In yet further embodiments, the diffusion barrier layers 114a-b may be co-doped with the barrier dopant (e.g., carbon) and the first dopant (e.g., phosphorus and/or arsenic) as illustrated and/or described in FIG. 2A. In such embodiments, the diffusion barrier layers 114a-b each comprise the first dopant having the first doping type (e.g., N-type) and may have a first doping concentration of the first dopant ranging between about $10^{19}$ to $4*10^{21}$ atoms/cm$^3$, or another suitable doping concentration value.

Figure 3B:
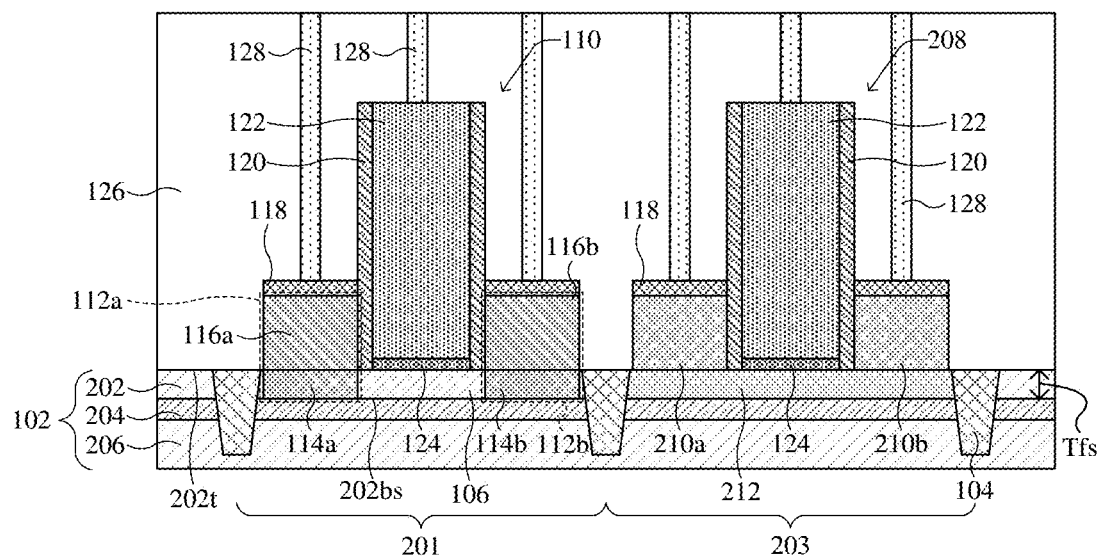

FIG. 3B illustrates a cross-sectional view of some alternative embodiments of the integrated chip 300 of FIG. 3A, in which the diffusion barrier layers 114a-b (i.e., the diffusion barrier regions) extend continuously from the top surface 202t of the first semiconductor material layer 202 to the bottom surface 202bs of the first semiconductor material layer 202. In such embodiments, the diffusion barrier layers 114a-b contact a top surface of the insulating layer 204.

Figure 3C:
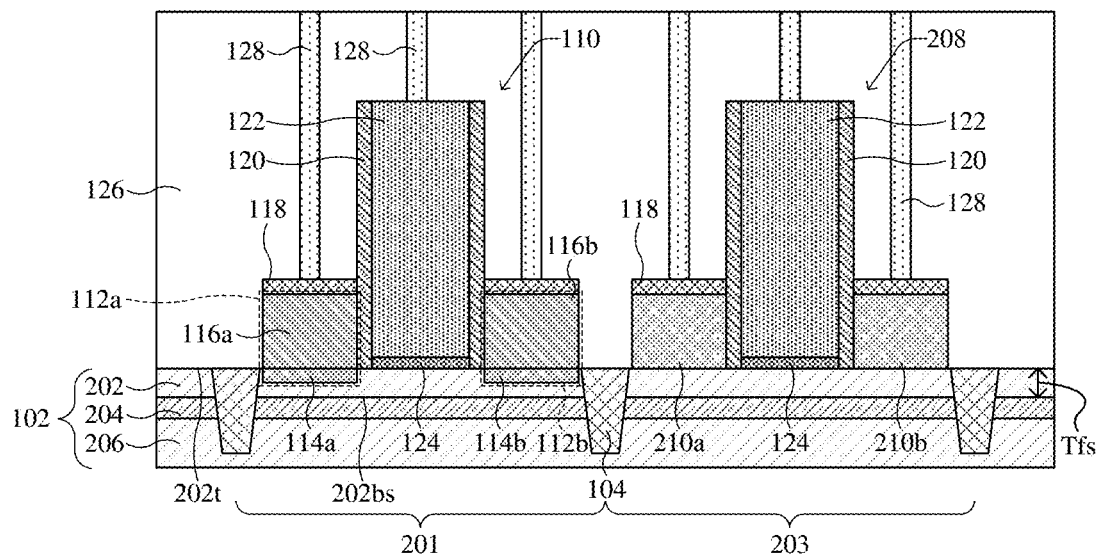

FIG. 3C illustrates a cross-sectional view of some alternative embodiments of the integrated chip 300 of FIG. 3A, in which the first well region (106 of FIG. 3A) and the second well region (212 of FIG. 3A) are omitted. In such embodiments, the thickness Tfs of the first semiconductor material layer 202 may be about 5 nm, within a range of about 0.5 to 15 nm, or another suitable thickness value. Further, regions the first semiconductor material layer 202 that are offset from the diffusion barrier layers 114a-b may for example, be or comprise intrinsic silicon, intrinsic monocrystalline silicon, another suitable material, or any combination of the foregoing.

Figure 3D:
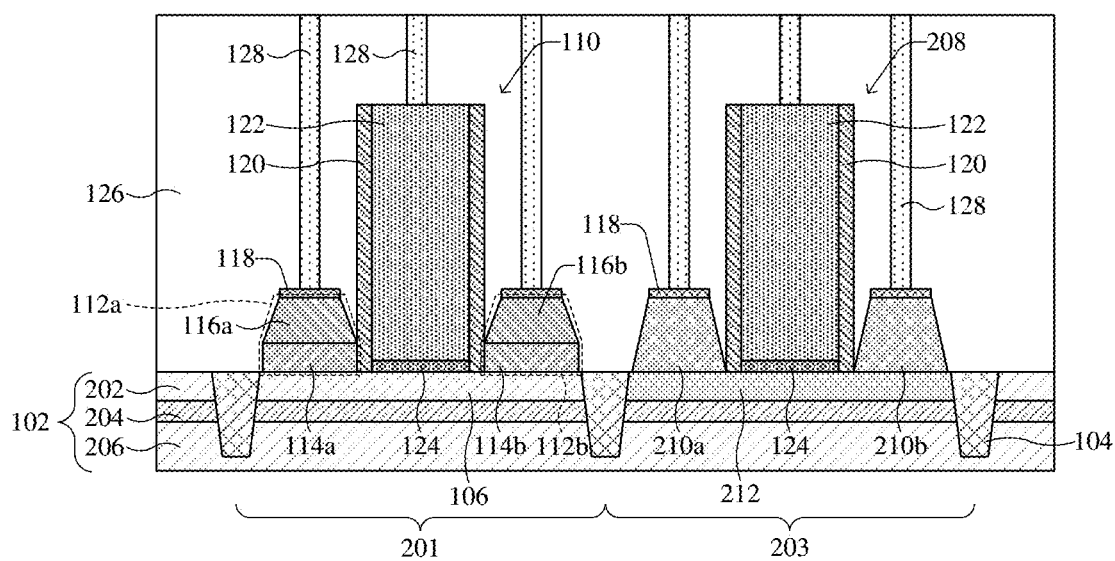
FIGS. 3D-3F illustrate cross-sectional views of some different alternative embodiments of the integrated chip of FIG. 2A.

FIG. 3D illustrates a cross-sectional view of some embodiments of an integrated chip 300 corresponding to some alternative embodiments of the integrated chip 200 of FIGS. 2A or 2B, in which the first pair of epitaxial source/drain layers 116a-b and the second pair of epitaxial source/drain layers 210a-b have a trapezoidal shape.

Figure 3E:
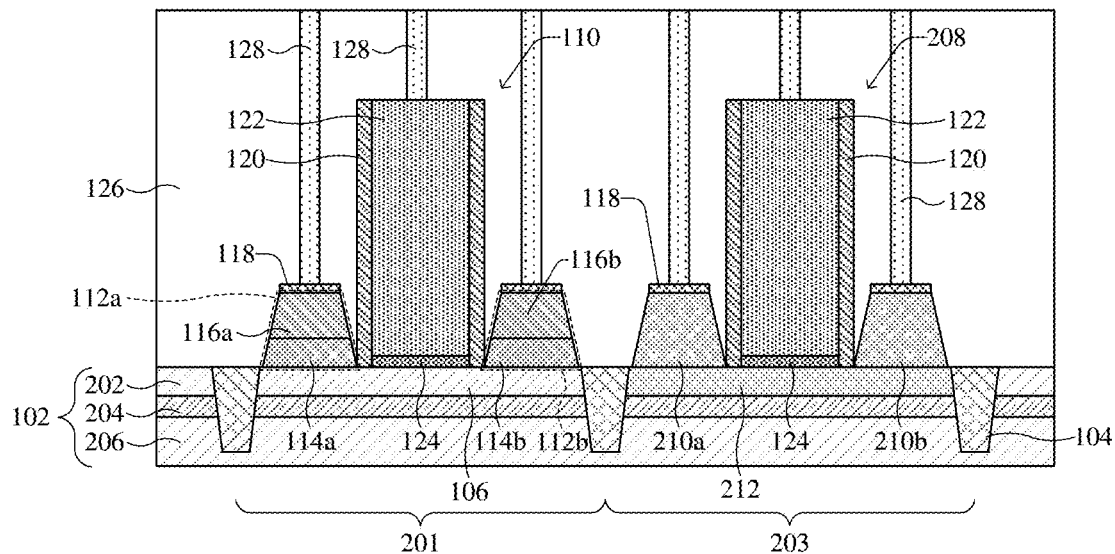

FIG. 3E illustrates a cross-sectional view of some alternative embodiments of the integrated chip 300 of FIG. 3D, in which the diffusion barrier layers 114a-b have a trapezoidal shape.

Figure 3F:
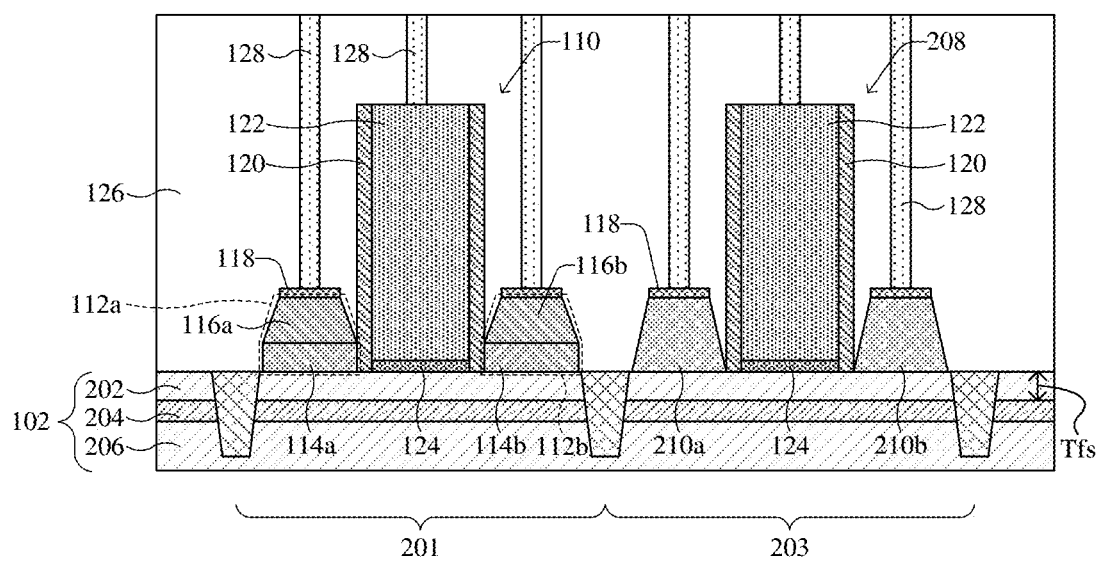

FIG. 3F illustrates a cross-sectional view of some alternative embodiments of the integrated chip 300 of FIG. 3D, in which the first well region (106 of FIG. 3D) and the second well region (212 of FIG. 3D) are omitted. In such embodiments, the thickness Tfs of the first semiconductor material layer 202 may be about 5 nm, within a range of about 0.5 to 15 nm, or another suitable thickness value. Further, the first semiconductor material layer 202 may for example, be or comprise intrinsic silicon, intrinsic monocrystalline silicon, another suitable material, or any combination of the foregoing.

Figure 4A:
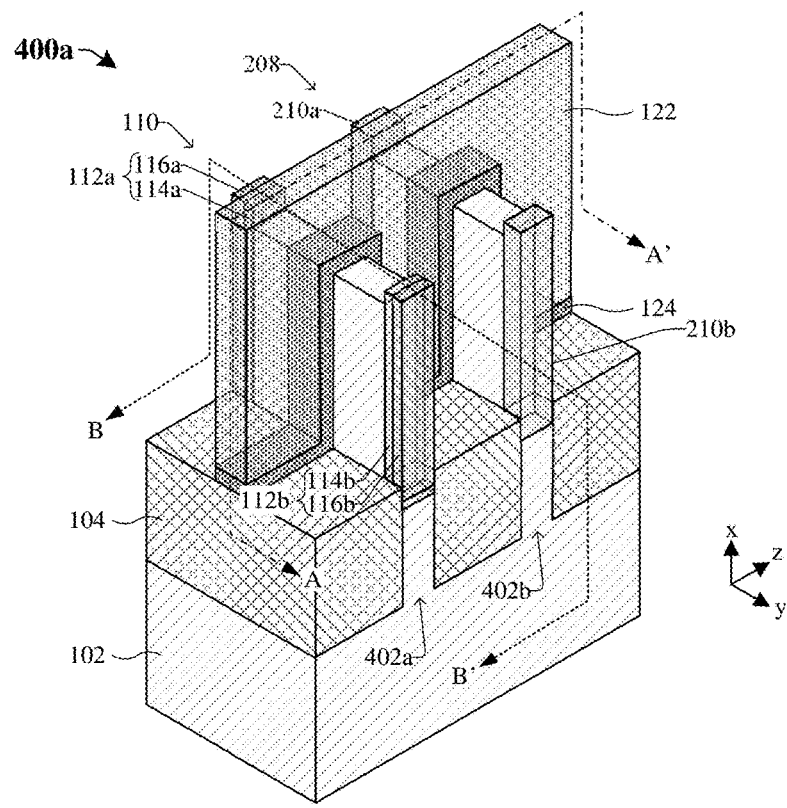

FIG. 4A illustrates a schematic view 400a of some different alternative embodiments of the integrated chip 200 of FIG. 2A, in which the first transistor 110 and the second transistor 208 are respectively configured as a FinFET device.

In some embodiments, the semiconductor substrate 102 comprises a first fin structure 402a and a second fin structure 402b. Each of the first and second fin structures 402a-b extend in parallel with one another in a first direction (e.g., along the "y" direction). In further embodiments, the first and second fin structures 402a-b are referred to as fins of the semiconductor substrate 102, respectively. The first and second fin structures 402a-b are laterally spaced from one another along a second direction (e.g., along the "z" direction). In some embodiments, the first direction is orthogonal to the second direction. Each of the first and second fin structures 402a, 402b comprise at least a portion of an upper region of the semiconductor substrate 102, respectively. The upper region of the semiconductor substrate 102 extends vertically from a lower region of the semiconductor substrate 102 along a third direction (e.g., along the 'x' direction). The upper region of the semiconductor substrate 102 extends continuously through the isolation structure 104.

The first pair of source/drain structures 112a-b is disposed on/over the first fin structure 402a. The source/drain structures 112a-b are laterally spaced (in the "y" direction). The gate electrode 122 and the gate dielectric layer 124 continuously extend along the second direction (e.g., along the "z" direction) from the first fin structure 402a to the second fin structure 402b. During operation of the first transistor 110, by applying suitable biasing conditions to the gate electrode 122 and the first pair of source/drain structures 112a-b, a selectively-conductive channel can be formed within the first fin structure 402a. The selectively-conductive channel extends (in the "y" direction) between the first pair of source/drain structures 112a-b. In yet further embodiments, the diffusion barrier layers 114a-b are disposed between corresponding epitaxial source/drain layers 116a-b and the semiconductor substrate 102. In such embodiments, each of the diffusion barrier layers 114a-b may be disposed along a sidewall of the first fin structure 402a and/or an upper surface of a portion of the first fin structure 402a.

The second pair of epitaxial source/drain layers 210a-b is disposed on/over the second fin structure 402b. The source/drain layers 210a-b are laterally spaced (in the "y" direction). During operation of the second transistor 208, by applying suitable biasing conditions to the gate electrode 122 and the second pair of epitaxial source/drain layers 210a-b, a selectively-conductive channel may be formed within the second fin structure 402b. The selectively-conductive channel extends (in the "y" direction) between the second pair of epitaxial source/drain layers 210a-b. In various embodiments, each of the source/drain layers 210a-b may be disposed along a sidewall of the second fin structure 402b and/or an upper surface of a portion of the second fin structure 402b. In further embodiments, the first transistor 110 may be configured as an n-type FinFET device and the second transistor 208 may be configured as a p-type FinFET device.

Figure 4B:
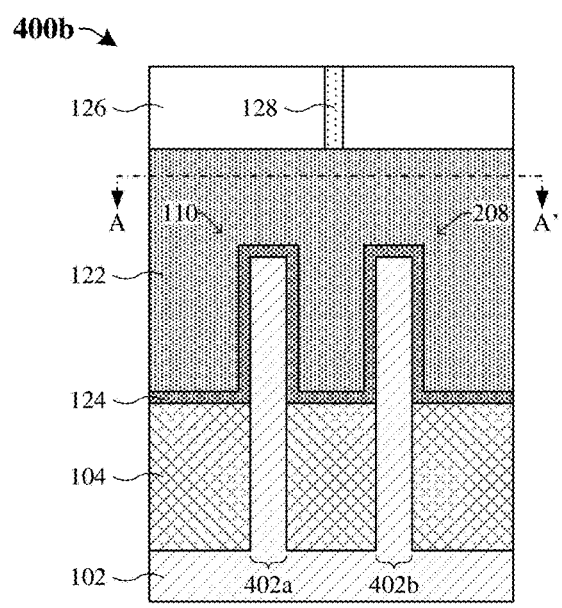
Figure 4C:
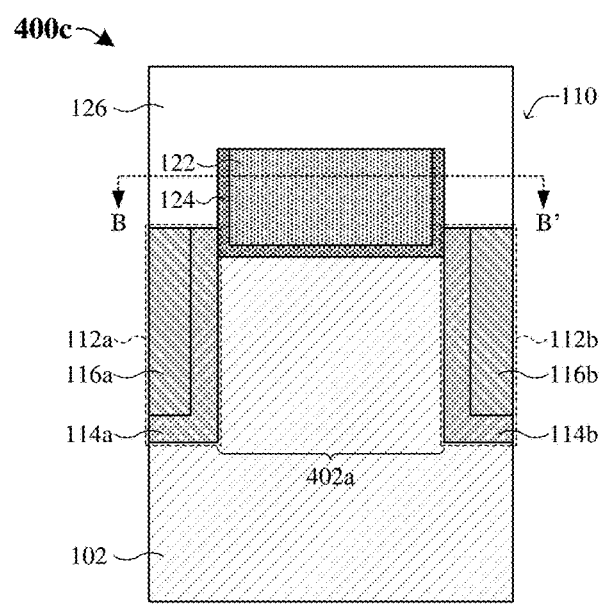

FIG. 4B illustrates a cross-sectional view 400b of some embodiments of the first and second transistors 110, 208 taken along the line A-A' of FIG. 4A. As illustrated in FIG. 4B, in some embodiments, the gate electrode 122 and the gate dielectric layer 124 continuously extend from the first fin structure 402a to the second fin structure 402b. FIG. 4C illustrates a cross-sectional view 400c of some embodiments of the first transistor 110 taken along the line B-B' of FIG. 4A. As illustrated in FIG. 4C, in some embodiments, the gate dielectric layer 124 continuously laterally extends from the first diffusion barrier layer 114a to the second diffusion barrier layer 114b.

FIG. 4D illustrates a schematic view 400d of some different alternative embodiments of the first and second transistors 110, 208 of FIG. 4A, in which the first transistor 110 and the second transistor 208 are respectively configured as a GAAFET device. In yet further embodiments, the first and second transistors 110, 208 may each be configured and/or referred to as a nanosheet field effect transistor (NSFET).

In some embodiments, a plurality of nanostructures 404 is disposed over each of the first and second fin structures 402a-b. In further embodiments, the nanostructures 404 are vertically stacked over one another and may be vertically spaced from a corresponding underlying fin structure 402a-b by a non-zero distance. In some embodiments, the plurality of nanostructures 404 comprise between two and twenty nanostructures, or another suitable number of nanostructures. For example, the plurality of nanostructures 404 overlying the corresponding first fin structure 402a comprises three nanostructures. In various embodiments, the nanostructures 404 each comprise a same material as the semiconductor substrate 102. The first pair of source/drain structures 112a-b may for example, be disposed on opposite sides of a corresponding plurality of nanostructures 404, such that the corresponding plurality of nanostructures 404 continuously laterally extend between the first pair of source/drain structures 112a-b. The second pair of epitaxial source/drain layers 210a-b may for example, be disposed on opposite sides of another corresponding plurality of nanostructures 404, such that the another corresponding plurality of nanostructures 404 continuously laterally extend between the second pair of epitaxial source/drain layers 210a-b. In yet further embodiments, the first pair of source/drain structures 112a-b and the second pair of epitaxial source/drain layers 210a-b may each have a hexagon-like shaped profile, a diamond-like shaped profile, a rectangle-like shaped profile, or another suitable profile.

FIG. 4E illustrates a cross-sectional view 400e of some embodiments of the first and second transistors 110, 208 taken along the line A-A' of FIG. 4D. As illustrated in FIG. 4E, in some embodiments, the gate dielectric layer 124 continuously surrounds an outer perimeter of each of the nanostructures 404. Further, the gate electrode 122 may be disposed vertically between each of the nanostructures 404. FIG. 4F illustrates a cross-sectional view 400f of some embodiments of the first transistor 110 taken along the line B-B' of FIG. 4D. As illustrated in FIG. 4F, in some embodiments, each of the nanostructures 404 continuously laterally extend from the first diffusion barrier layer 114a to the second diffusion barrier layer 114b.

Figure 5A:
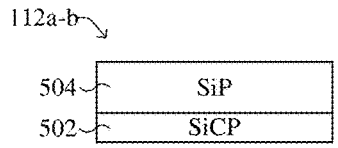
FIGS. 5A-5C through 8A-8C illustrate cross-sectional views of some embodiments of a detailed breakout of layers of an epitaxial source/drain layer and an underlying diffusion barrier layer.
Figure 5B:
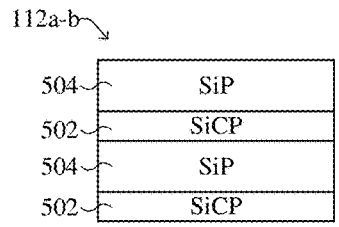
Figure 5C:
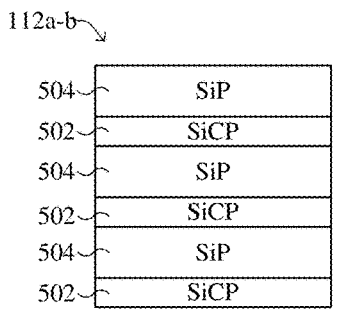

FIGS. 5A-C illustrate cross-sectional views of some various embodiments of a detailed break out of layers of the first pair of source/drain structures 112a-b of the first transistor 110 of FIGS. 1, 2A-2E, or 3A-3F. In such embodiments, the source/drain structures 112a-b each comprise a multilayer stack of epitaxial layers.

With reference to FIG. 5A, the source/drain structures 112a-b each comprise a first epitaxial layer 502 and a second epitaxial layer 504 over the first epitaxial layer 502, where the first dopant is, for example, phosphorus (P). In some embodiments, the first epitaxial layer 502 (in some embodiments, referred to as a diffusion barrier epitaxial layer) may consist of or consist essentially of silicon, the first dopant (e.g., phosphorus), and the barrier dopant (e.g., carbon), such as SiCP. Further, the second epitaxial layer 504 (in some embodiments, referred to as an epitaxial source/drain layer) may for example, consist of or consist essentially of silicon and the first dopant, such as SiP. In various embodiments, a doping concentration and/or an atomic percentage of the first dopant and the barrier dopant within the first epitaxial layer 502 may be the same as the diffusion barriers layer 114a-b of FIG. 2A. In further embodiments, a doping concentration and/or an atomic percentage of the first dopant within the second epitaxial layer 504 may be the same as the first pair of epitaxial source/drain layers 116a-b of FIG. 2A. In various embodiments, a doping concentration of the first dopant (e.g., phosphorus) within the first epitaxial layer 502 and the second epitaxial layer 504 may be different from one another. In alternative embodiments, a doping concentration of the first dopant within the first epitaxial layer 502 and the second epitaxial layer 504 is approximately the same.

In further embodiments, the first pair of source/drain structures 112a-b each comprise an alternating stack of layers comprising the first epitaxial layer 502 and the second epitaxial layer 504. For example, as illustrated in FIG. 5B, the alternating stack of layers can include two first epitaxial layers 502 and two second epitaxial layers 504. In another example, as illustrated in FIG. 5C, the alternating stack of layers can include three first epitaxial layers 502 and three second epitaxial layers 504. It will be appreciated that the alternating stack of layers may for example, include any number of the first epitaxial layers 502 and the second epitaxial layers 504. In various embodiments, a doping concentration of elements within the first epitaxial layers 502 may be different from one another, and a doping concentration of the first dopant within the second epitaxial layers 504 may be different from one another. In some embodiments, by virtue of the first epitaxial layers 502 respectively comprising the barrier dopant, each first epitaxial layer 502 may prevent diffusion of the first dopant from one or more second epitaxial layer(s) 504 overlying and/or underlying a corresponding first epitaxial layer 502.

Figure 6A:
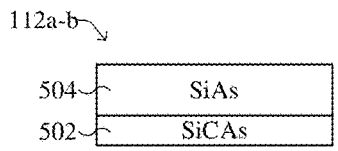
Figure 6B:
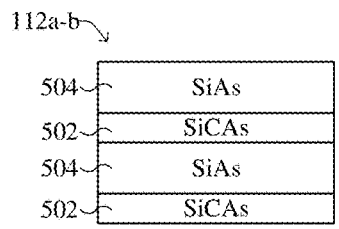
Figure 6C:
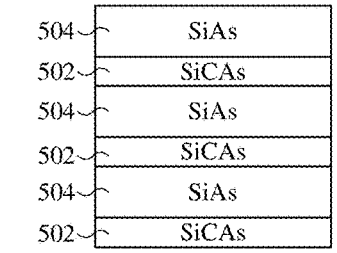

FIGS. 6A-C illustrate cross-sectional views of some embodiments of the detailed break out of layers of the first pair of source/drain structures 112a-b corresponding to some alternative embodiments of FIGS. 5A-C, in which the first dopant is arsenic (As). Thus, the first epitaxial layer(s) 502 may for example, consist of or consist essentially of silicon, arsenic, and carbon, such as SiCAs. The second epitaxial layer(s) 504 may for example, consist of or consist essentially of silicon and arsenic, such as SiAs.

Figure 7A:
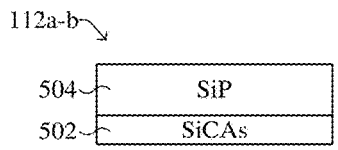
Figure 7B:
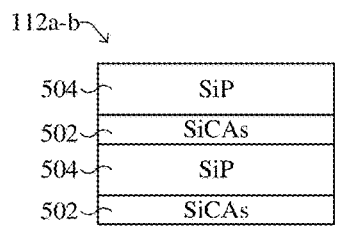
Figure 7C:
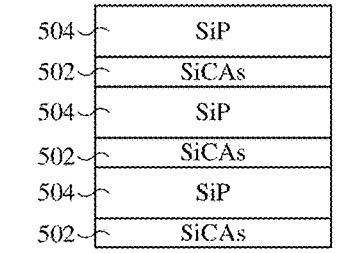

FIGS. 7A-C illustrate cross-sectional views of some embodiments of the detailed break out of layers of the first pair of source/drain structures 112a-b corresponding to some alternative embodiments of FIGS. 5A-C, in which the first dopant of the second epitaxial layer(s) 504 is phosphorus, and the first epitaxial layer(s) 502 comprise(s) a second dopant, such as arsenic (As). In some embodiments, the first dopant is different from the second dopant, and the first and second dopants are both N-type dopants. In further embodiments, a doping concentration and/or atomic percentage of the second dopant within the first epitaxial layer(s) 502 is within a same range and/or value as the doping concentration and/or atomic percentage of the first dopant within the diffusion barrier layers 114a-b of FIG. 1 or 2A. Thus, the first epitaxial layer(s) 502 may for example, consist of or consist essentially of silicon, arsenic, and carbon, such as SiCAs. The second epitaxial layer(s) 504 may for example, consist of or consist essentially of silicon and phosphorus, such as SiP.

Figure 8A:
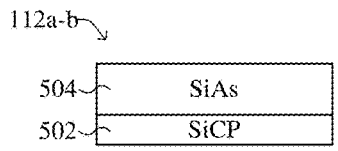
Figure 8B:
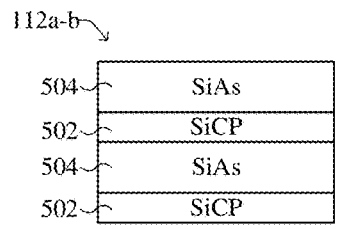
Figure 8C:
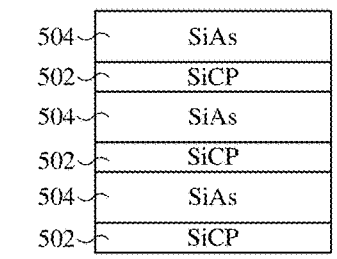

FIGS. 8A-C illustrate cross-sectional views of some embodiments of the detailed break out of layers of the first pair of source/drain structures 112a-b corresponding to some alternative embodiments of FIGS. 5A-C, in which the second dopant of the first epitaxial layer(s) 502 is phosphorus (P), and the first dopant of the second epitaxial layer(s) 502 is arsenic (As). Thus, the first epitaxial layer(s) 502 may for example, consist of or consist essentially of silicon, phosphorus, and carbon, such as SiCP. The second epitaxial layer(s) 504 may for example, consist of or consist essentially of silicon and arsenic, such as SiAs.

Figures 9A, 9B:
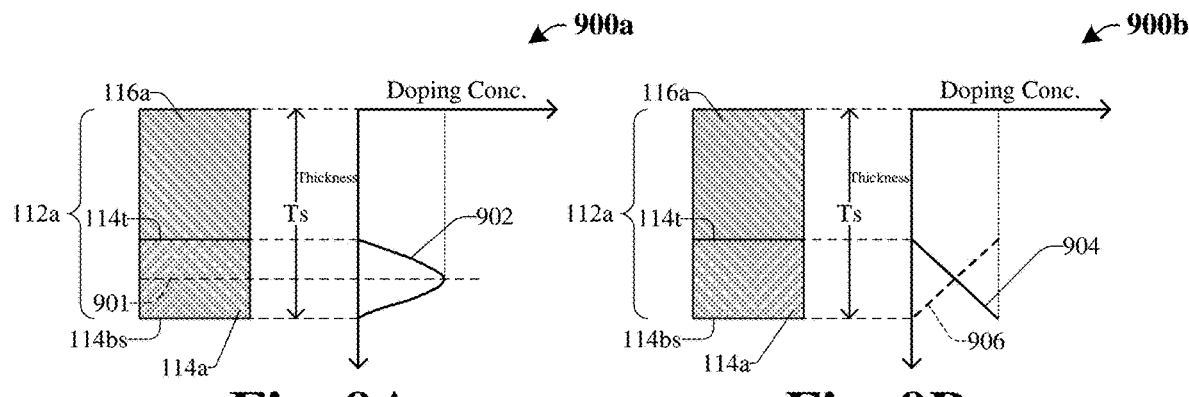
FIGS. 9A and 9B illustrate various graphs corresponding to some different embodiments of a concentration of a barrier dopant within each diffusion barrier layer of FIGS. 1 through 8C.

FIG. 9A illustrates a graph 900a corresponding to some embodiments of a doping profile of the barrier dopant (e.g., carbon) across the thickness Ts of the first source/drain structure 112a of FIGS. 1 through 8C. It will be appreciated that although the graph 900a illustrates and describes the doping profile across the thickness Ts of the first source/drain structure 112a, the illustrated doping profile may correspond to the doping profile of the barrier dopant across the thickness Ts of the second source/drain structure 112b of FIGS. 1 through 8C. In such embodiments, the second diffusion barrier layer 114b may have a same doping profile as the first diffusion barrier layer 114a is described below. Further, the y-axis of the graph 900a corresponds to the thickness Ts of the first source/drain structure 112a. The x-axis of the graph 900a corresponds to a doping concentration of the barrier dopant (e.g., carbon) within the first source/drain structure 112a.

A doping concentration curve 902 correspond to some embodiments of a doping concentration of the barrier dopant (e.g., carbon) within the first source/drain structure 112a. As can be seen by the curve 902, the doping concentration of the barrier dopant continuously increases from a top surface 114t of the first diffusion barrier layer 114a to a horizontal line 901 and continuously decreases from the horizontal line 901 to a bottom surface 114bs of the first diffusion barrier layer 114a. In such embodiments, the first diffusion barrier layer 114a may be formed by an epitaxial process in which a flow of a barrier dopant precursor gas is constant during the epitaxial process (e.g., see FIG. 14), or the first diffusion barrier layer 114a may be formed by a single implantation process (e.g., see FIG. 23). Thus, in some embodiments, a doping profile of the barrier dopant within the first diffusion barrier layer 114a follows a guassian distribution. Further, the horizontal line 901 is, for example, parallel to the bottom surface 114bs of the first diffusion barrier layer 114a. It will be appreciated that the doping profile of the barrier dopant within the first diffusion barrier layer 114a having another distribution is within the scope of the disclosure. A peak of the doping concertation of the barrier dopant is disposed along the horizontal line 901.

FIG. 9B illustrates a graph 900b corresponding to some alternative embodiments of the doping profile of the barrier dopant (e.g., carbon) across the thickness Ts of the first source/drain structure 112a of FIGS. 1 through 8C. It will be appreciated that although the graph 900b illustrates and describes the doping profile across the thickness Ts of the first source/drain structure 112a, the illustrated doping profile may correspond to the doping profile of the barrier dopant across the thickness Ts of the second source/drain structure 112b of FIGS. 1 through 8C. In such embodiments, the second diffusion barrier layer 114b may have a same doping profile as the first diffusion barrier layer 114a is described below.

A first doping concentration curve 904 and a second doping concentration curve 906 correspond to some embodiments of a doping concentration of the barrier dopant (e.g., carbon) within the first source/drain structure 112a. With reference to the first curve 904, the doping concentration of the barrier dopant can continuously increase from the top surface 114t of the first diffusion barrier layer 114a to the bottom surface 114bs of the first diffusion barrier layer 114a. In such embodiments, the first diffusion barrier layer 114a may be formed by an epitaxial process in which a flow of a barrier dopant precursor gas gradually decreases during the epitaxial process (e.g., see FIG. 14). Thus, in some embodiments, a peak of the doping concentration of the barrier dopant is located along the bottom surface 114bs of the first diffusion barrier layer 114a.

With reference to the second curve 906, the doping concentration of the barrier dopant can continuously increase from the bottom surface 114bs of the first diffusion barrier layer 114a to the top surface 114t of the first diffusion barrier layer 114a. In such embodiments, the first diffusion barrier layer 114a may be formed by multiple implantation processes, in which each implantation process may be configured to implant a different concentration of carbon within the first diffusion barrier layer 114a (e.g., see FIG. 23). In some embodiments, a peak of the doping concentration of the barrier dopant is located along the top surface 114t of the first diffusion barrier layer 114a. Thus, as illustrated by the first and second curves 904, 906, the doping profile of the barrier dopant within the first diffusion barrier layer 114a follows a gradient distribution. It will be appreciated that the doping profile of the barrier dopant within the first diffusion barrier layer 114a having another distribution is within the scope of the disclosure.

Figure 10A:
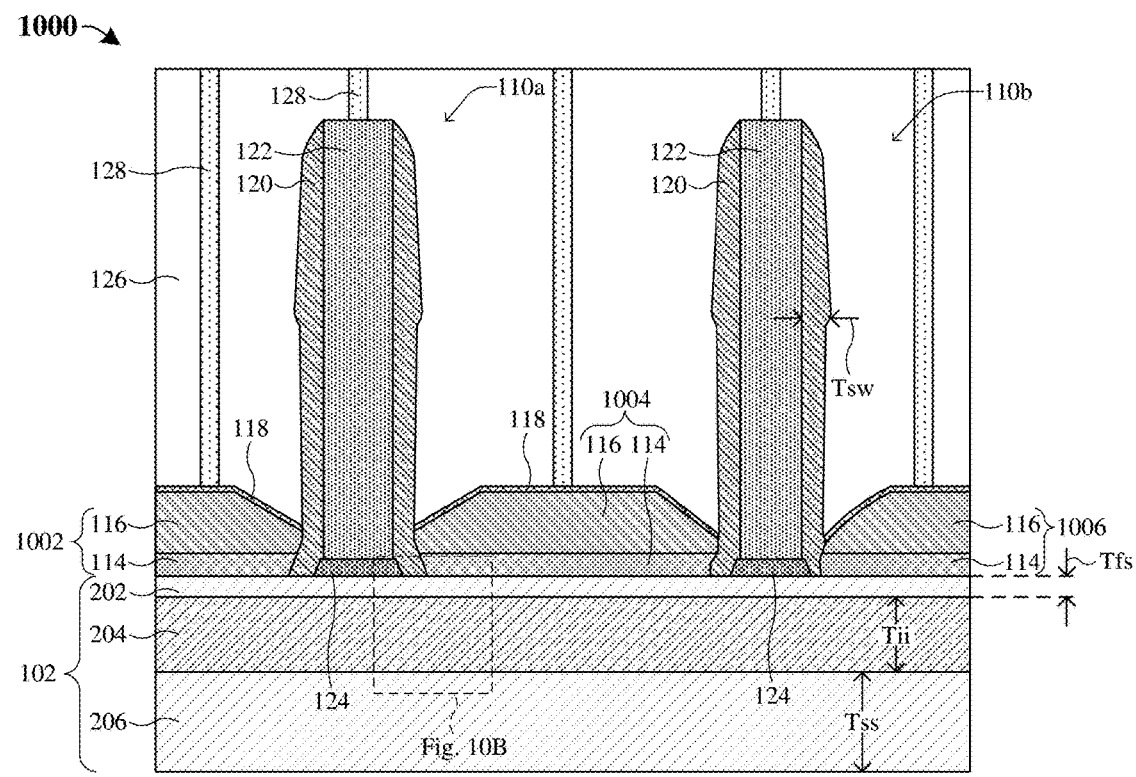
FIG. 10A illustrates a cross-sectional view of some embodiments of an integrated chip comprising a first N-type metal oxide semiconductor (NMOS) transistor spaced laterally adjacent to a second NMOS transistor.

FIG. 10A illustrates a cross-sectional view of some embodiments of an integrated chip 1000 comprising a first transistor device 110a laterally adjacent to a second transistor device 110b.

The integrated chip 1000 includes a plurality of source/drain structures 1002-1006. The plurality of source/drain structures 1002-1006 include a first source/drain structure 1002, a second source/drain structure 1004, and a third source/drain structure 1006. Further, the first and second transistor devices 110a, 110b each comprise a gate electrode 122, a gate dielectric layer 124, and a sidewall spacer structure 120. The first source/drain structure 1002 and the second source/drain structure 1004 are disposed on opposing sides of the gate electrode 122 of the first transistor device 110a. Further, the second source/drain structure 1004 and the third source/drain structure 1006 are disposed on opposing sides of the gate electrode 122 of the second transistor device 110b. Thus, the second source/drain structure 1004 is disposed directly between the first and second transistor devices 110a, 110b, such that the second source/drain structure 1004 is a common source/drain structure. Further, each source/drain structure 1002-1006 comprise an epitaxial source/drain layer 116 and a diffusion barrier layer 114. It will be appreciated that the epitaxial source/drain layer 116 may be configured as the epitaxial source/drain layers 116a-b of FIG. 2A, and the diffusion barrier layer 114 may be configured as the diffusion barrier layers 114a-b of FIG. 2A. In yet further embodiments, the first and second transistor devices 110a, 110b may each be configured as the first transistor 110 of FIG. 2A, such that the first and second transistor devices 110a, 110b are both configured as an N-type metal oxide semiconductor (NMOS) transistor. Further, a thickness Tss of the second semiconductor material layer 206 may be greater than the thickness Tfs of the first semiconductor material layer 202. Further, a thickness Tsw of the sidewall spacer structure 120 may for example, be about 3 nm, 4 nm, 5 nm, within a range of about 3 to 6 nm, or another suitable value. A thickness Tii of the insulating layer 204 may for example, be about 18 nm, within a range of about 15 to 20 nm, or another suitable value. In some embodiments, the thickness Tfs of the first semiconductor material layer 202 may be about 5 nm, within a range of about 5 to 30 nm, or another suitable value.

Figure 10B:
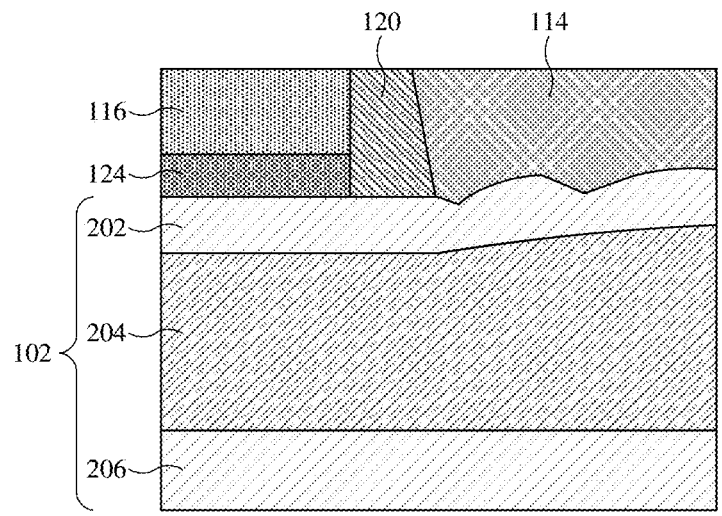
FIG. 10B illustrates a cross-sectional view of some embodiments of a section of the integrated chip of FIG. 10A.

FIG. 10B illustrates a cross-sectional view of some embodiments of a section of the integrated chip of FIG. 10A, in which the diffusion barrier layer 114 continuously extends from a sidewall of the sidewall spacer structure 120 to an upper surface of the first semiconductor material layer 202. In some embodiments, the diffusion barrier layer 114 and the first semiconductor material layer 202 each have a face-center-cubic (fcc) structure with a [100] orientation.

FIGS. 11-22 illustrate cross-sectional views 1100-2200 of some embodiments of a first method for forming an integrated chip comprising a first transistor and a second transistor disposed within/over a substrate, where the first transistor comprises diffusion barrier layers disposed between the substrate and epitaxial source/drain layers according to the present disclosure. Although the cross-sectional views 1100-2200 shown in FIGS. 11-22 are described with reference to a first method, it will be appreciated that the structures shown in FIGS. 11-22 are not limited to the first method but rather may stand alone separate of the first method. Although FIGS. 11-22 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 11:
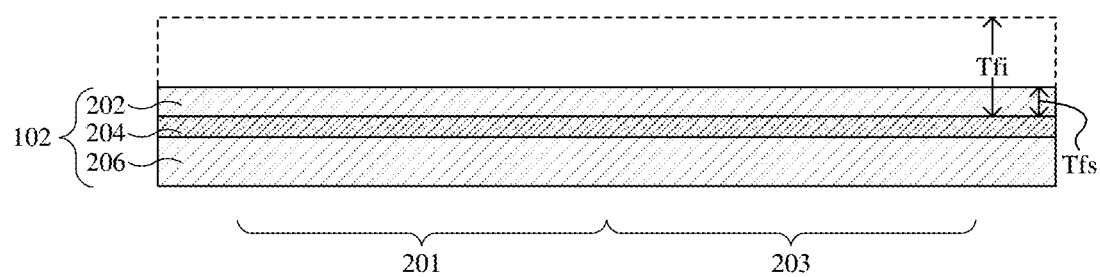
FIGS. 11-22 illustrate cross-sectional views of some embodiments of a first method for forming an integrated chip comprising a first transistor and a second transistor disposed within/over a substrate, where the first transistor comprises diffusion barrier layers disposed between the substrate and epitaxial source/drain layers.

As shown in cross-sectional view 1100 of FIG. 11, a semiconductor substrate 102 is provided, where the semiconductor substrate 102 comprises an N-type metal oxide semiconductor (NMOS) region 201 laterally adjacent to and a P-type metal oxide semiconductor (PMOS) region 203. The semiconductor substrate 102 comprises a first semiconductor material layer 202, an insulating layer 204, and a second semiconductor material layer 206. In various embodiments, the semiconductor substrate 102 is a semiconductor-on-insulator (SOI) substrate. The first semiconductor material layer 202 may for example, be or comprise crystalline silicon, doped silicon, intrinsic silicon, or the like. Further, the first semiconductor material layer 202 can have a face-center-cubic (fcc) structure with a [100] orientation.

In addition, as illustrated in FIG. 11, a thinning process is performed on the first semiconductor material layer 202. In some embodiments, the thinning process reduces an initial thickness Tfi of the first semiconductor material layer 202 to a thickness Tfs. The initial thickness Tfi may for example, be within a range of about 20 to 30 nm, or another suitable value. Further, the thickness Tfs is, for example, about 5 nm, within a range of about 0.5 to 15 nm, or another suitable thickness value. The thinning process may for example, include performing a planarization process (e.g., a chemical mechanical planarization (CMP) process), a mechanical grinding process, an etching process, another suitable thinning process, or any combination of the foregoing. In an embodiment, the thinning process can solely include an etching process where the first semiconductor material layer 202 is exposed to one or more etchants, such as hydrochloric acid (HCl), thereby reducing the thickness of the first semiconductor material layer 202 from the initial thickness Tfi to the thickness Tfs.

Figure 12:
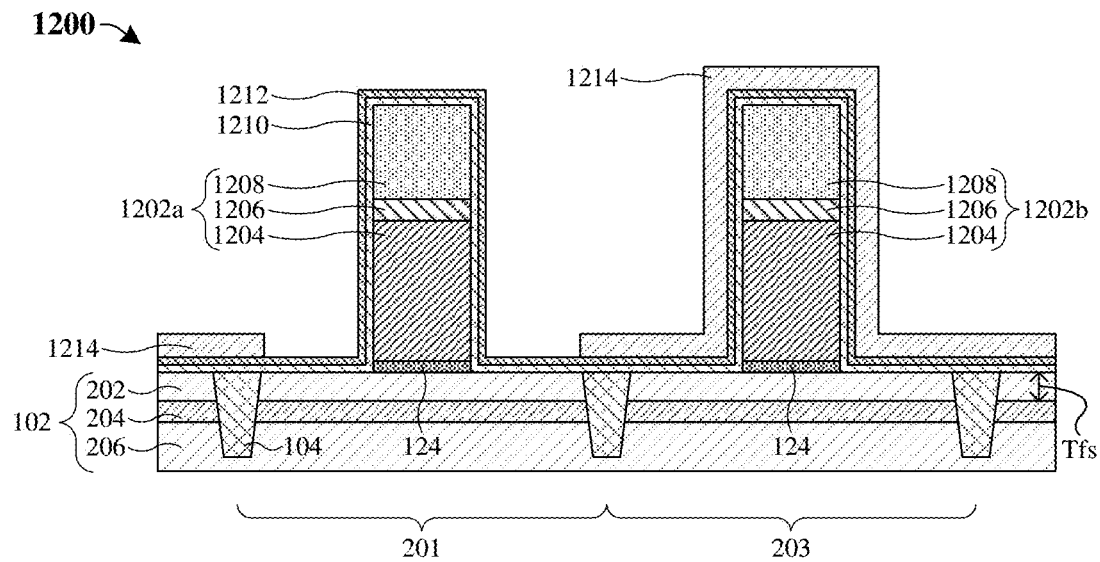

As shown in cross-sectional view 1200 of FIG. 12, a plurality of dummy gate structures 1202a-b and gate dielectric layers 124 are formed over the semiconductor substrate 102, and an isolation structure 104 is formed within the semiconductor substrate 102. In some embodiments, the dummy gate structures 1202a-b may be configured or referred to as dummy gate electrode structures. Further, the plurality of dummy gate structures 1202a-b include a first dummy gate structure 1202a and a second dummy gate structure 1202b.

In addition, a process for forming the structure of FIG. 12 may for example, include forming the isolation structure 104 within the semiconductor substrate 102, and forming the gate dielectric layers 124 over the semiconductor substrate 102. Subsequently, the plurality of dummy gate structures 1202a-b are formed over the gate dielectric layers 124. The dummy gate structures 1202a-b may include a polysilicon layer 1204, an upper dielectric layer 1208, and a lower dielectric layer 1206 disposed between the polysilicon layer 1204 and the upper dielectric layer 1208. Further, a first spacer layer 1210 is deposited over the plurality of dummy gate structures 1202a-b, and a second spacer layer 1212 is deposited over the first spacer layer 1210. The first and second spacer layers 1210, 1212 may for example, be deposited by chemical vapor deposition (CVD), physical vapor deposition (PVD), atomic layer deposition (ALD), or another suitable deposition or growth process. In some embodiments, the first and second spacer layers 1210, 1212 may be or comprise silicon nitride, silicon carbide, another dielectric material, or any combination of the foregoing. Further, a masking layer 1214 is formed over the semiconductor substrate 102, such that the masking layer 1214 covers layers within the PMOS region 203, and leaves regions of the NMOS region 201 uncovered and/or exposed.

Figure 13:
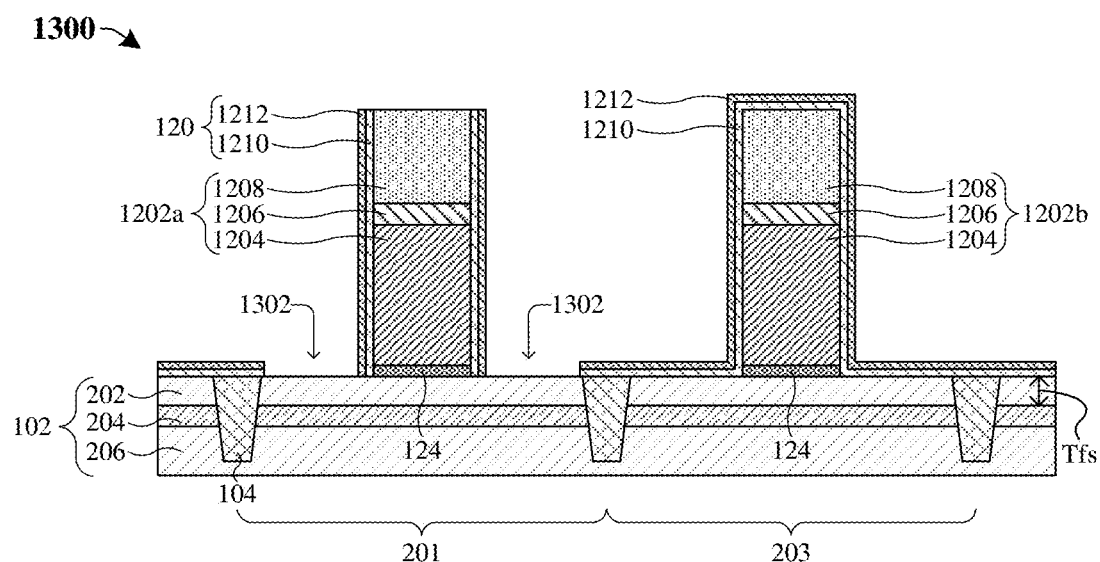

As shown in cross-sectional view 1300 of FIG. 13, a patterning process is performed on the first and second spacer layers 1210, 1212 within the NMOS region 201, thereby forming a sidewall spacer structure 120 and first source/drain openings 1302 within the NMOS region 201. In various embodiments, the sidewall spacer structure 120 comprises the first and second spacer layers 1210, 1212 disposed along sidewalls of the first dummy gate structure 1202a. In some embodiments, the patterning process is performed according to the masking layer (1214 of FIG. 12), and subsequently a removal process is performed to remove the masking layer (1214 of FIG. 12) from over the semiconductor substrate 102. The patterning process may for example, include performing a wet etch process, a dry etch process, or any combination of the foregoing.

Figure 14:
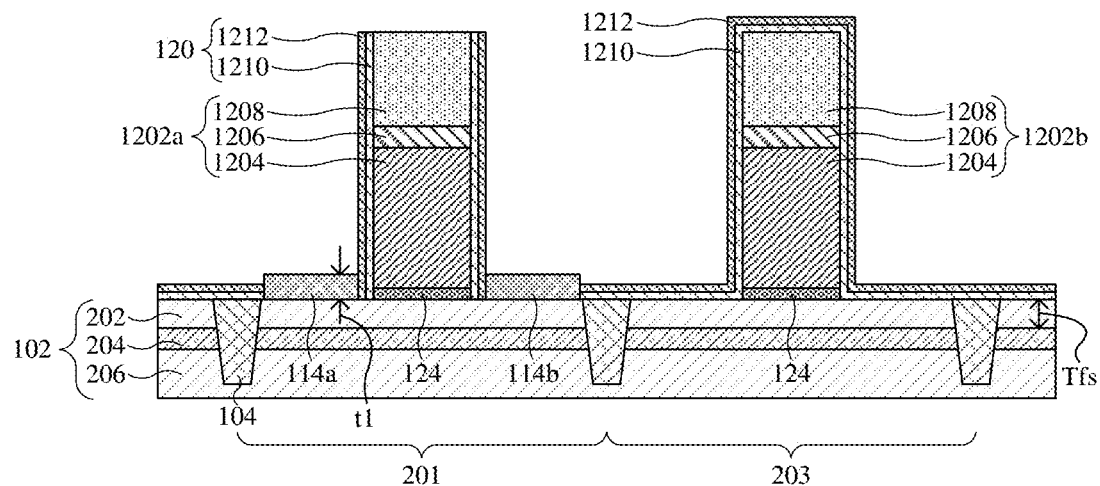

As shown in cross-sectional view 1400 of FIG. 14, diffusion barrier layers 114a-b are formed within the first source/drain openings (1302 of FIG. 13) and on opposing sides of the first dummy gate structure 1202a within the NMOS region 201. In some embodiments, the diffusion barrier layers 114a-b may be formed by a selective epitaxial growth process to selectively deposit the diffusion barrier layers 114a-b within the first source/drain openings (1302 of FIG. 13). Further, the diffusion barrier layers 114a-b comprise, for example, silicon, a first dopant (e.g., arsenic (As), phosphorus (P), or the like) having a first doping type (e.g., N-type), and a barrier dopant (e.g., carbon). The selective epitaxial growth process may be an epitaxial process or another form of a deposition process, for example, chemical vapor deposition (CVD), metal organic chemical vapor deposition (MO-CVD), plasma enhanced chemical vapor deposition (PE-CVD), atomic layer deposition (ALD), physical vapor deposition (PVD), sputtering, electron beam/thermal evaporation, etc.

In further embodiments, the diffusion barrier layers 114a-b are formed such that the diffusion barrier layers 114a-b each have a first doping concentration of the first dopant that is about $1.2*10^{20}$ atoms/cm$^3$, about $1.2*10^{21}$ atoms/cm$^3$, within a range of about $10^{19}$ to $4*10^{21}$ atoms/cm$^3$, or another suitable doping concentration value. In various embodiments, a first atomic percentage of the first dopant within each of the diffusion barrier layers 114a-b may be about 2 percent, within a range of about 0.2 to 8 percent, or another suitable percentage value. Further, the diffusion barrier layers 114a-b are formed such that the diffusion barrier layers 114a-b each have a second doping concentration of the barrier dopant that is about $5.2*10^{20}$ atoms/cm$^3$, within a range of about $10^{19}$ to $3*10^{21}$ atoms/cm$^3$, or another suitable doping concentration value. In various embodiments, a second atomic percentage of the barrier dopant within the diffusion barrier layers 114a-b may be about 1 percent, within a range of about 0.2 to 6 percent, or another suitable percentage value. Thus, in some embodiments, the second atomic percentage of the barrier dopant within the diffusion barrier layers 114a-b is less than the first atomic percentage of the first dopant within the diffusion barrier layers 114a-b.

Further, for example, suppose that the diffusion barrier layers 114a-b comprise silicon, carbon, and phosphorus (SiCP). Deposition of the SiCP may be carried out in a CVD reactor, an LPCVD reactor, or an ultra-high vacuum CVD (UHVCVD). The reactor temperature may be about 590° Celsius, or between about 500° Celsius. and 650° Celsius. In addition, the reactor pressure may be about 10 Torr, or between about 10 to 300 Torr. A carrier gas in the reactor may consist of hydrogen ($H_2$) or nitrogen ($N_2$). The deposition can be carried out using a silicon precursor gas such as dichlorosilane (DCS or $SiH_2Cl_2$), silane ($SiH_4$), or disilane ($Si_2H_6$) and a chlorine precursor gas such as hydrogen chloride (HCl). Further, the deposition may also use a phosphorus source precursor gas (i.e., a first dopant precursor gas) such as phosphane ($PH_3$), and a carbon source precursor gas (i.e., a barrier dopant precursor gas) such as monomethylsilane ($CH_6Si$). In some embodiments, the aforementioned deposition process may be referred to as a selective epitaxial growth process. In an alternative embodiment, the phosphorus precursor gas may be replaced with an arsenic precursor gas, such that the diffusion barrier layers 114a-b comprise SiCAs. Accordingly, the diffusion barrier layers 114a-b may be grown and in-situ doped with the first dopant and the barrier dopant, such that the diffusion barrier layer 114a-b is co-doped with the first dopant and the barrier dopant. In some embodiments, a flow of the barrier dopant precursor gas may be constant during the deposition process, such that a doping profile of the barrier dopant within the diffusion barrier layers 114a-b has a gaussian distribution (e.g., as illustrated and/or described in FIG. 9A). In an alternative embodiment, a flow of the barrier dopant precursor gas may gradually decrease during the deposition process, such that a doping profile of the barrier dopant within the diffusion barrier layers 114a-b has a gradient distribution (e.g., as illustrated and/or described in FIG. 9B). In yet further embodiments, after the diffusion barrier layer 114a-b is grown, one or more doping processes may be performed on the diffusion barrier layer 114a-b to selectively dope the diffusion barrier layer 114 with the first dopant and/or the barrier dopant, thereby adjusting a doping concentration of the first dopant and/or the barrier dopant to a suitable value.

In another embodiment, forming the diffusion barrier layers 114a-b may include: depositing epitaxial silicon layers within the first source/drain openings (1302 of FIG. 13); and performing one or more doping processes on the epitaxial silicon layers, thereby forming the diffusion barrier layers 114a-b. The one or more doping processes may include selectively implanting the first dopant and the barrier dopant (e.g., carbon) into the epitaxial silicon layers, such that the diffusion barrier layers 114a-b may be co-doped with the first dopant and the barrier dopant. Further, the diffusion barrier layers 114a-b are formed to a first thickness t1 that may for example, be within a range of about 1 to 5 nm. Furthermore, by forming the diffusion barrier layers 114a-b with an epitaxial process, the diffusion barrier layers 114a-b may have a same crystal structure and orientation as the first semiconductor material layer 202 (e.g., a face-center-cubic (fcc) structure with a [100] orientation). By virtue of the diffusion barrier layers 114a-b comprising the barrier dopant (e.g., carbon), diffusion of the first dopant from the diffusion barrier layers 114a-b and/or subsequently formed overlying doped layers (e.g., the first pair of epitaxial source/drain layers 116a-b of FIG. 15) may be mitigated during subsequent processing steps and during operation of the first transistor (110 of FIG. 20).

Figure 15:
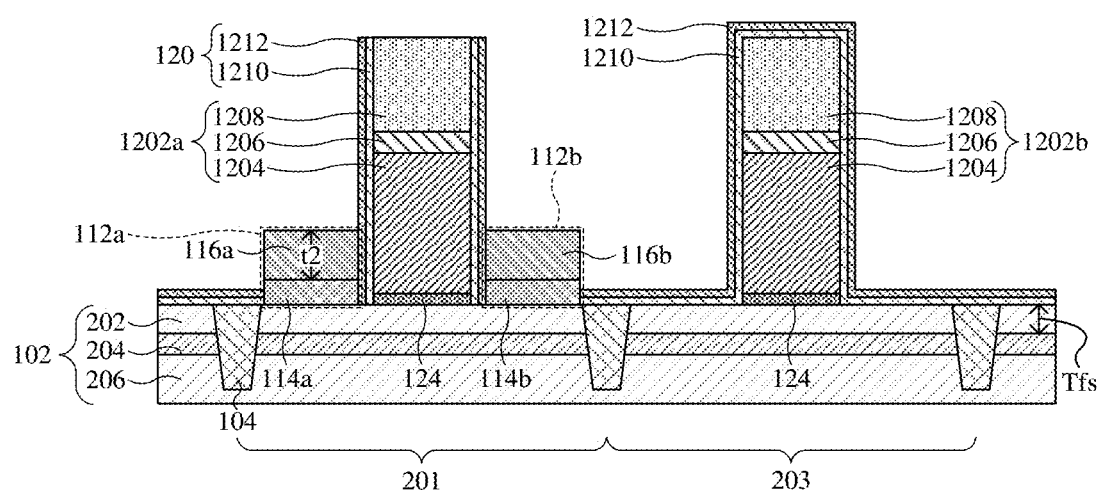

As shown in cross-sectional view 1500 of the FIG. 15, a first pair of epitaxial source/drain layers 116a-b are formed over the diffusion barrier layers 114a-b and within the NMOS region 201, thereby forming a first pair of source/drain structures 112a-b on opposing sides of the first dummy gate structure 1202a. The first pair of source/drain structures 112a-b include the first pair of epitaxial source/drain layers 116 and the diffusion barrier layers 114a-b. In some embodiments, the first pair of epitaxial source/drain layers 116a-b may be formed by a selective epitaxial growth process to selectively deposit the first pair of epitaxial source/drain layers 116a-b on the diffusion barrier layers 114a-b. Further, the first pair of epitaxial source/drain layers 116a-b comprise, for example, silicon and the first dopant (e.g., arsenic (As), phosphorus (P), or the like). The selective epitaxial growth process may be an epitaxial process or another form of a deposition process, for example, CVD, MO-CVD, PE-CVD, ALD, PVD, sputtering, electron beam/thermal evaporation, etc. In some embodiments, the first dopant within the first pair of epitaxial source/drain layers 116a-b may be different from the first dopant within the diffusion barrier layers 114a-b. In some embodiments, the first pair of epitaxial source/drain layers 116a-b are formed such that the first pair of epitaxial source/drain layers 116a-b have a doping concentration of the first dopant that is about $3*10^{21}$ atoms/cm$^3$, within a range of about $10^{19}$ to $4*10^{21}$ atoms/cm$^3$, or another suitable doping concentration value. In yet further embodiments, an atomic percentage of the first dopant within the first pair of epitaxial source/drain layers 116a-b may be about 6 percent, within a range of about 0.2 to 8 percent, or another suitable percentage value.

Further, for example, suppose that the first pair of epitaxial source/drain layers 116a-b comprise silicon and phosphorus (SiP). Deposition of the SiP may be carried out in a CVD reactor, an LPCVD reactor, or an ultra-high vacuum CVD (UHVCVD). The reactor temperature may be about 680° Celsius, or between about 550° Celsius and 750° Celsius. In addition, the reactor pressure may be about 300 Torr, or between about 50 to 500 Torr. A carrier gas in the reactor may consist of hydrogen ($H_2$) or nitrogen ($N_2$). The deposition can be carried out using a silicon precursor gas such as dichlorosilane (DCS or $SiH_2Cl_2$), silane ($SiH_4$), or disilane ($Si_2H_6$) and a chlorine precursor gas such as hydrogen chloride (HCl). In some embodiments, the aforementioned deposition process may be referred to as a selective epitaxial growth process. The deposition process may for example, also use a phosphorus source precursor gas (i.e., a first dopant precursor gas) such as phosphane ($PH_3$). In an alternative embodiment, the phosphorus precursor gas may for example, be replaced with an arsenic precursor gas, such that the first pair of epitaxial source/drain layers 116a-b comprise SiAs. Accordingly, the first pair of epitaxial source/drain layers 116a-b may be grown and in-situ doped with the first dopant. In yet further embodiments, after the first pair of epitaxial source/drain layers 116a-b is grown, one or more doping processes may be performed on the first pair of epitaxial source/drain layers 116a-b to selectively dope the first pair of epitaxial source/drain layers 116a-b with the first dopant, thereby adjusting a doping concentration of the first dopant to a suitable value.

In another embodiment, forming the first pair of epitaxial source/drain layers 116a-b may include: depositing epitaxial silicon layers within over the diffusion barrier layers 114a-b; and performing one or more doping processes on the epitaxial silicon layers, thereby forming the first pair of epitaxial source/drain layers 116a-b. The one or more doping processes may include selectively implanting the first dopant into the epitaxial silicon layers, such that the first pair of epitaxial source/drain layers 116a-b is doped with the first dopant. Further, the first pair of epitaxial source/drain layers 116a-b are formed to a second thickness t2 that may for example, be within a range of about 5 to 40 nm, or another suitable value. Furthermore, by forming the first pair of epitaxial source/drain layers 116a-b with an epitaxial process, the first pair of epitaxial source/drain layers 116a-b may have a same crystal structure and orientation as the first semiconductor material layer 202 and/or the diffusion barrier layers 114a-b (e.g., a face-center-cubic (fcc) structure with a [100] orientation).

Figure 16:
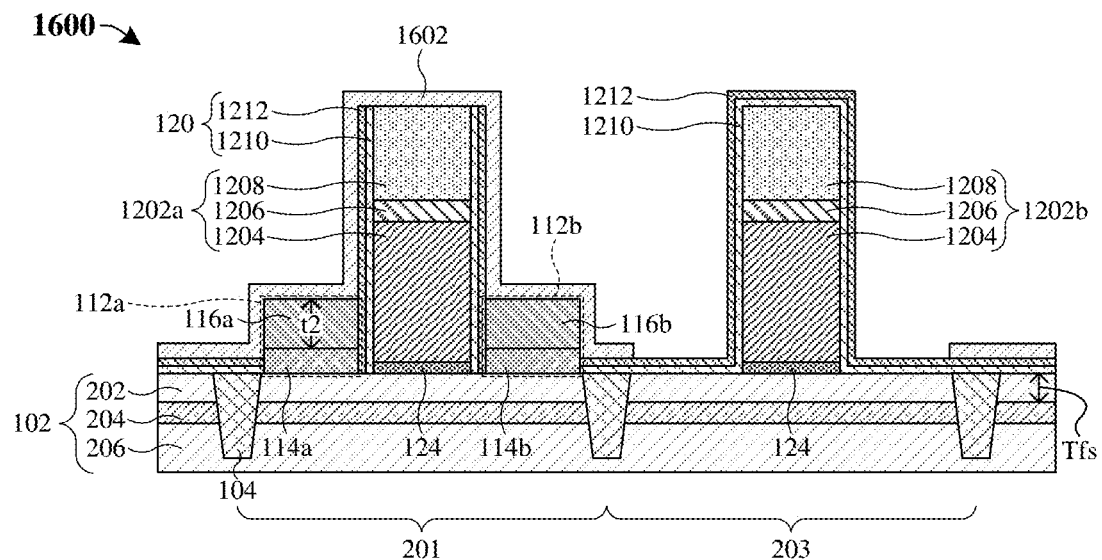

As shown in the cross-sectional view 1600 of FIG. 16, a masking layer 1602 is selectively formed over the structure of FIG. 15. The masking layer 1602 leaves areas of the PMOS region 203 exposed/unmasked.

Figure 17:
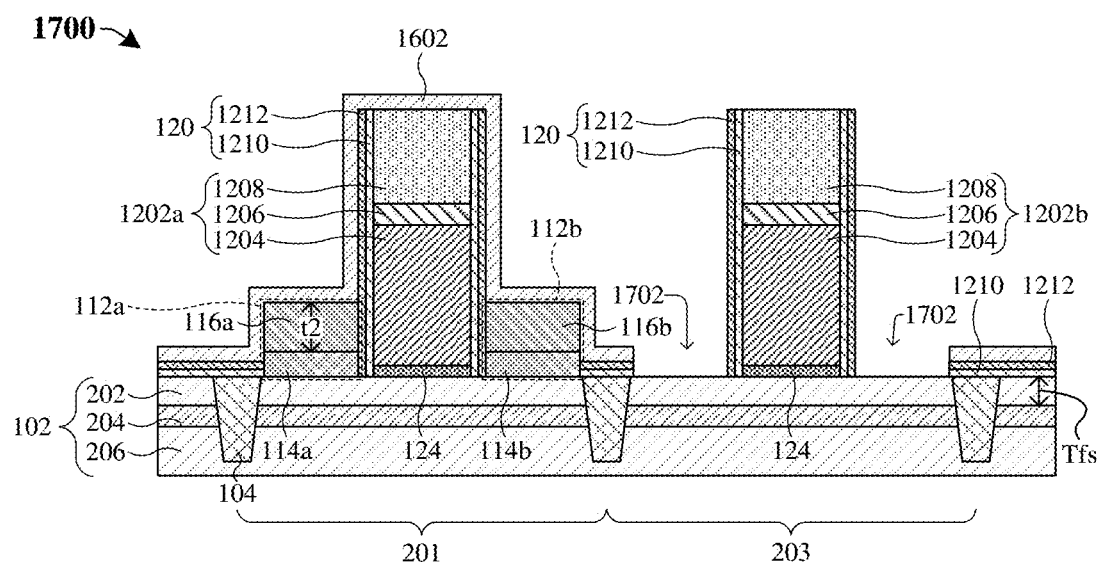

As shown in the cross-sectional view 1700 of FIG. 17, a patterning process is performed on the first semiconductor material layer 202 according to the masking layer 1602, thereby forming second source/drain layer openings 1702 within the first semiconductor material layer 202 and on opposing sides of the second dummy gate structure 1202b. The patterning process further forms the sidewall spacer structure 120 disposed along opposing sidewalls of the second dummy gate structure 1202b. In some embodiments, the patterning process may include performing a dry etch process, a wet etch process, or another suitable etch process on unmasked areas of the structure of FIG. 16.

Figure 18:
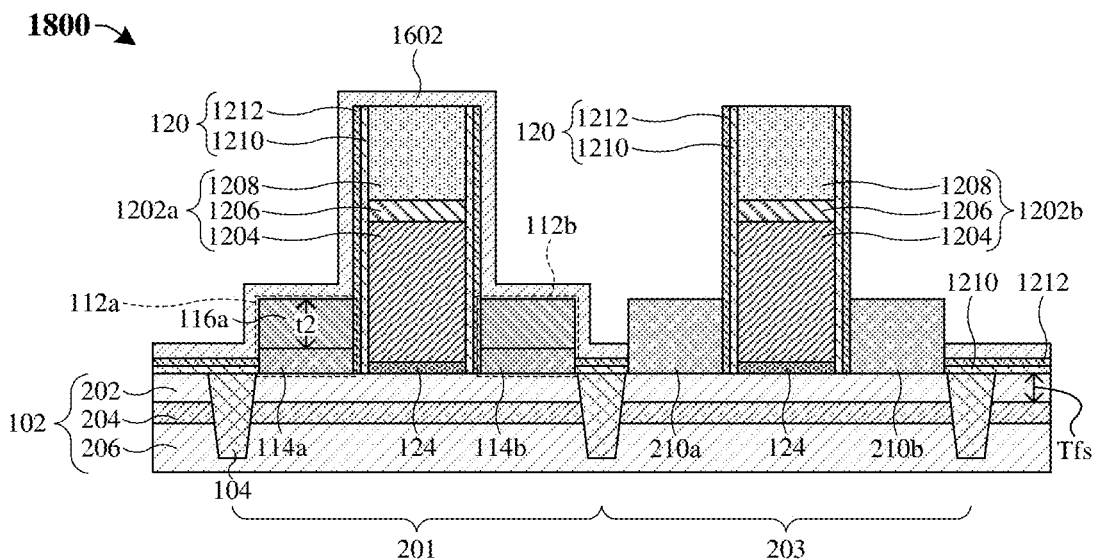

As shown in the cross-sectional view 1800 of FIG. 18, a second pair of epitaxial source/drain layers 210a-b are formed within the second source/drain layer openings (1702 of FIG. 17) and are disposed on opposing sides of the second dummy gate structure 1202b. In some embodiments, the second pair of epitaxial source/drain layers 210a-b may be selectively formed by a selective epitaxial growth process to selectively deposit the second pair of epitaxial source/drain layers 210a-b on the first semiconductor material layer 202. Further, the second pair of epitaxial source/drain layers 210a-b each comprise, for example, silicon germanium (SiGe) and each have a second doping type (e.g., P-type) opposite the first doping type (e.g., N-type). The selective epitaxial growth process may be an epitaxial process or another form of a deposition process, for example, CVD, MO-CVD, PE-CVD, ALD, PVD, sputtering, electron beam/thermal evaporation, etc. In yet further embodiments, the second pair of epitaxial source/drain layers 210a-b is devoid of the first dopant and/or the barrier dopant, such that a doping concentration of the first dopant and/or the barrier dopant within each of the epitaxial source/drain layers 210a-b is less than a corresponding doping concentration within the the epitaxial source/drain layers 116a-b and the diffusion barrier layers 114, respectively. Further, after forming the second pair of epitaxial source/drain layers 210a-b, one or more removal processes(es) is/are performed to remove the masking layer 1602, and/or the first and second spacer layers 1210, 1212 disposed along a top surface of the first semiconductor material layer 202 (not shown).

Figure 19:
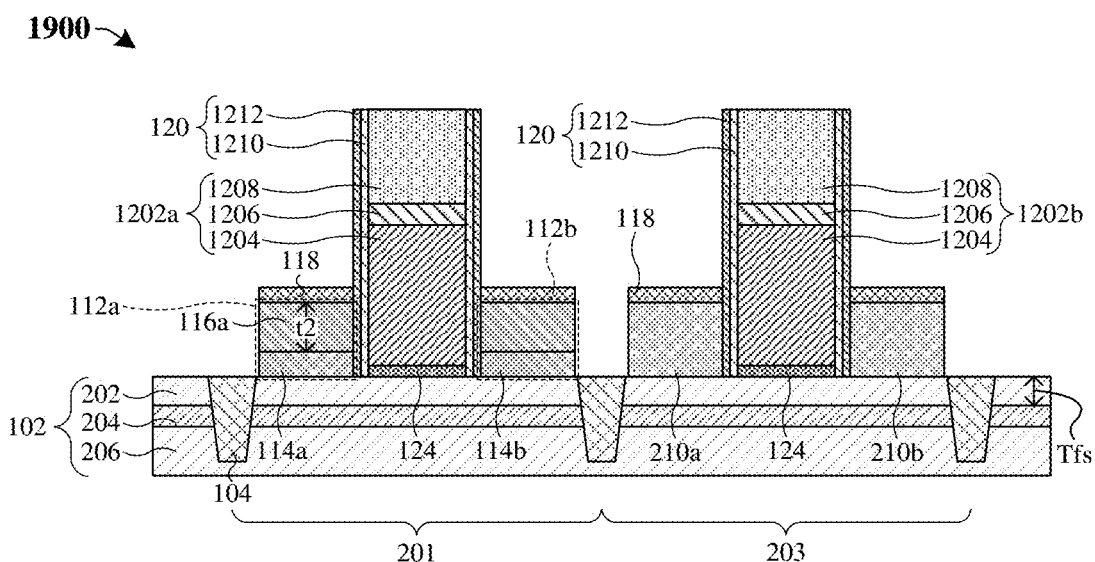

As shown in the cross-sectional view 1900 of FIG. 19, silicide layers 118 are formed over the first pair of epitaxial source/drain layers 116a-b and the second pair of epitaxial source/drain layers 210a-b. In some embodiments, the silicide layers 118 may for example, be or comprise nickel silicide, titanium silicide, another suitable material, or any combination of the foregoing.

Figure 20:
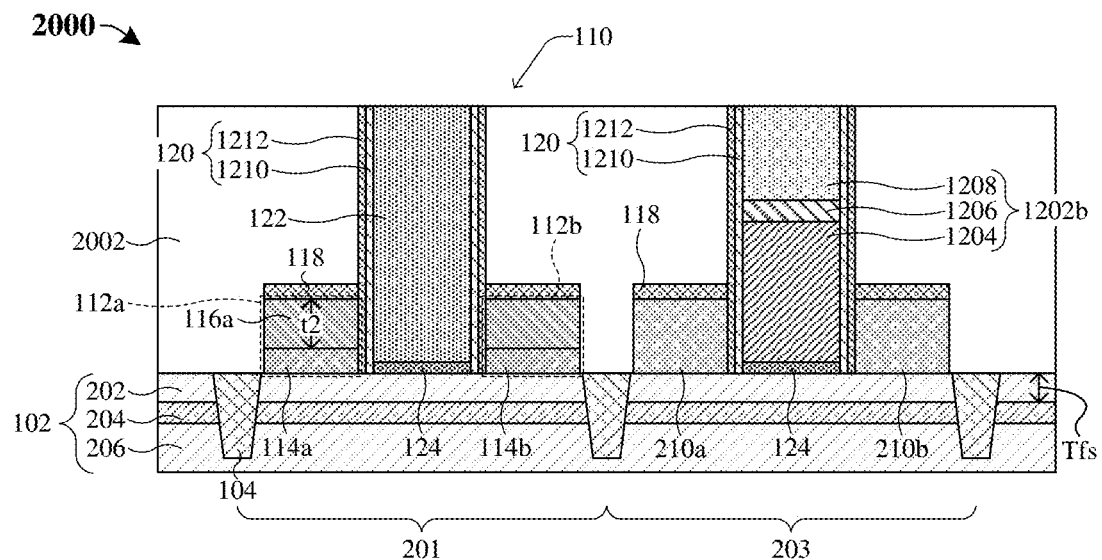

As shown in the cross-sectional view 2000 of FIG. 20, a lower inter-level dielectric (ILD) layer 2002 is deposited over the semiconductor substrate 102. In some embodiments, the lower ILD layer 2002 may be deposited by CVD, PVD, ALD, or another suitable growth or deposition process. The lower ILD layer 2002 may for example, be or comprise silicon dioxide, a low κ dielectric material, or the like. Further, a selective removal process is performed to remove the first dummy gate structure (1202a of FIG. 19) from within the NMOS region 201, and subsequently a gate electrode 122 is formed over the gate dielectric layer 124 within the NMOS region 201, thereby forming a first transistor 110. The selective removal process may for example, include: forming a masking layer (not shown) over the PMOS region 203 and/or over areas of the NMOS region 201; performing a patterning process on the NMOS region 201 according to the masking layer, thereby removing the first dummy gate structure (1202a of FIG. 19) and forming a first gate electrode opening (not shown) over the gate dielectric layer 124 in the NMOS region 201. Further, forming the gate electrode 122 of the first transistor 110 includes depositing (e.g., by CVD, PVD, sputtering, electro plating, electroless plating, or another suitable deposition or growth process) a gate electrode material over the gate dielectric layer 124 within the NMOS region 201.

Figure 21:
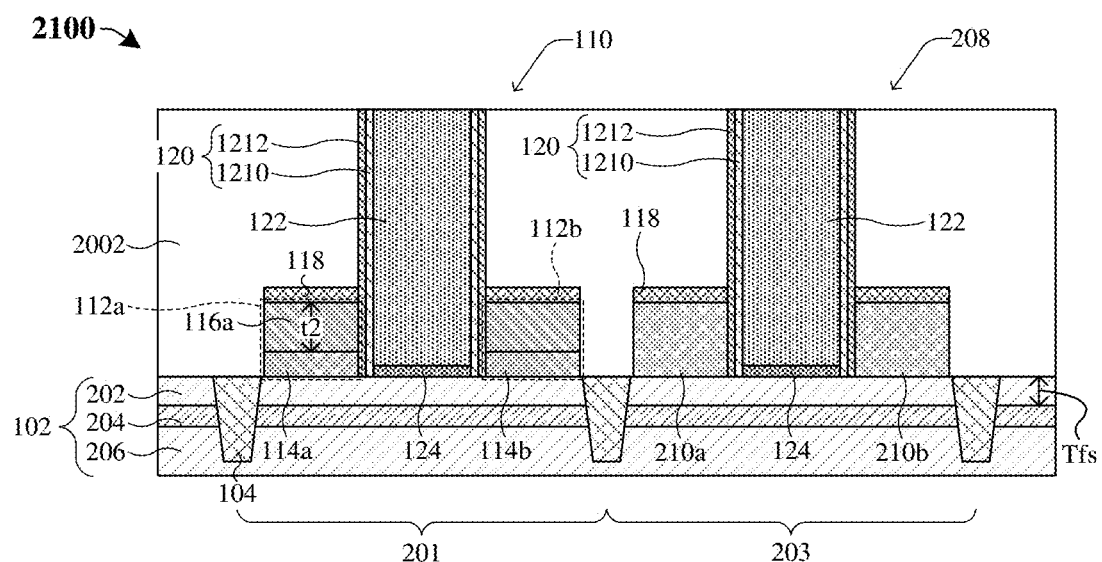

A shown in the cross-sectional view 2100 of FIG. 21, a gate electrode 122 is formed over the gate dielectric layer 124 within the PMOS region 203, thereby forming a second transistor 208. Forming the gate electrode 122 of the second transistor 208 may for example, include: forming a masking layer (not shown) over the NMOS region 201 and/or over areas of the PMOS region 203; performing a patterning process on the PMOS region 203 according to the masking layer, thereby removing the second dummy gate structure (1202b of FIG. 20); and depositing a gate electrode material (e.g., by CVD, PVD, sputtering, electro plating, electroless plating, or another suitable deposition or growth process) over the gate dielectric layer 124 within the PMOS region 203, thereby forming the gate electrode 122 of the second transistor 208.

Figure 22:
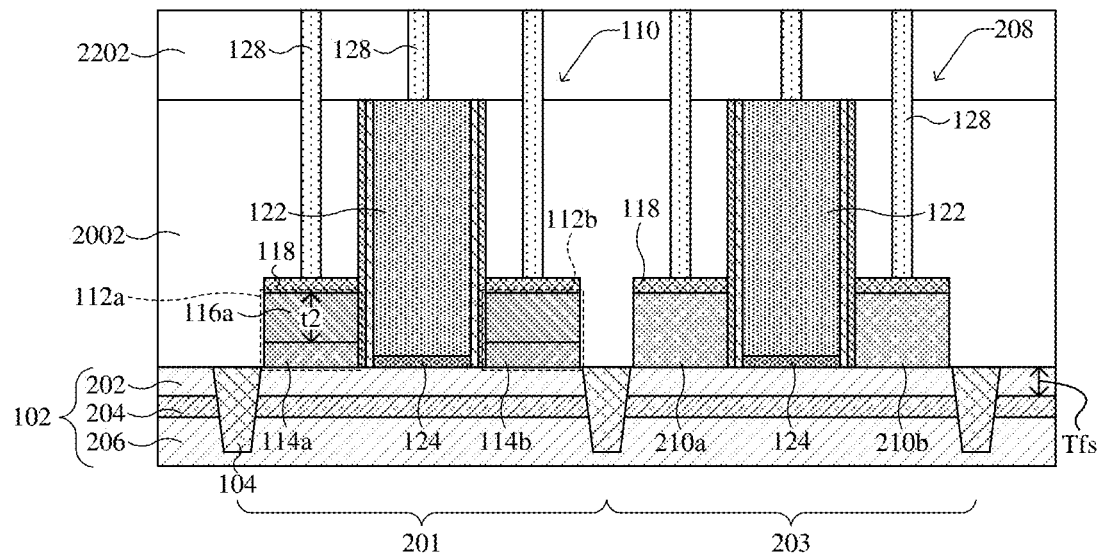

As shown in the cross-sectional view 2200 of FIG. 22, an upper ILD layer 2202 is formed over the lower ILD layer 2002, and a plurality of conductive contacts 128 are formed within the lower and upper ILD layers 2002, 2202. In some embodiments, the upper ILD layer 2202 may be deposited by CVD, PVD, ALD, or another suitable growth or formation process. Further, the plurality of conductive contacts 128 may for example, be formed by a single damascene process, or another suitable formation process.

Figure 23:
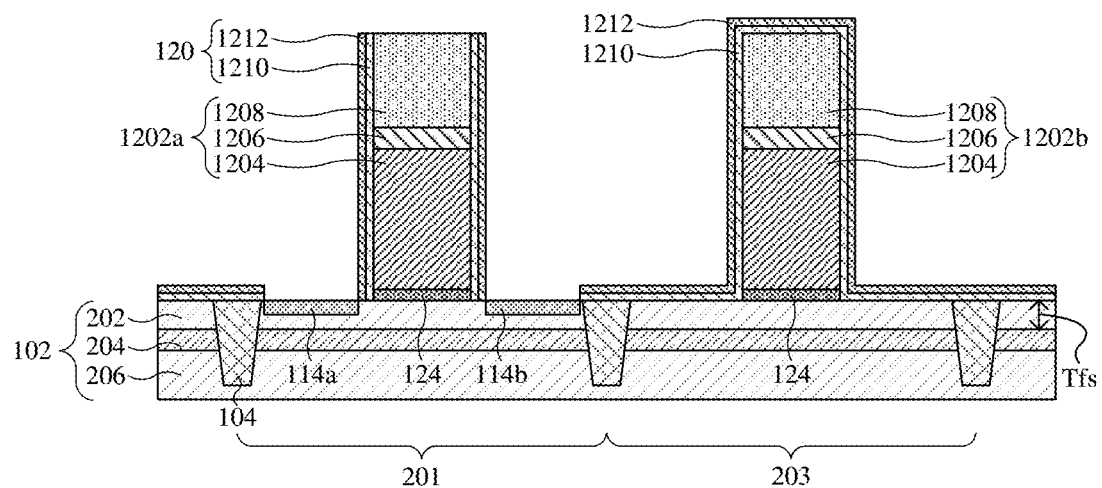
FIGS. 23-25 illustrate cross-sectional views of some embodiments of a second method for forming an integrated chip comprising a first transistor and a second transistor disposed within/over a substrate, where the first transistor comprises diffusion barrier layers disposed between the substrate and epitaxial source/drain layers.
Figure 24:
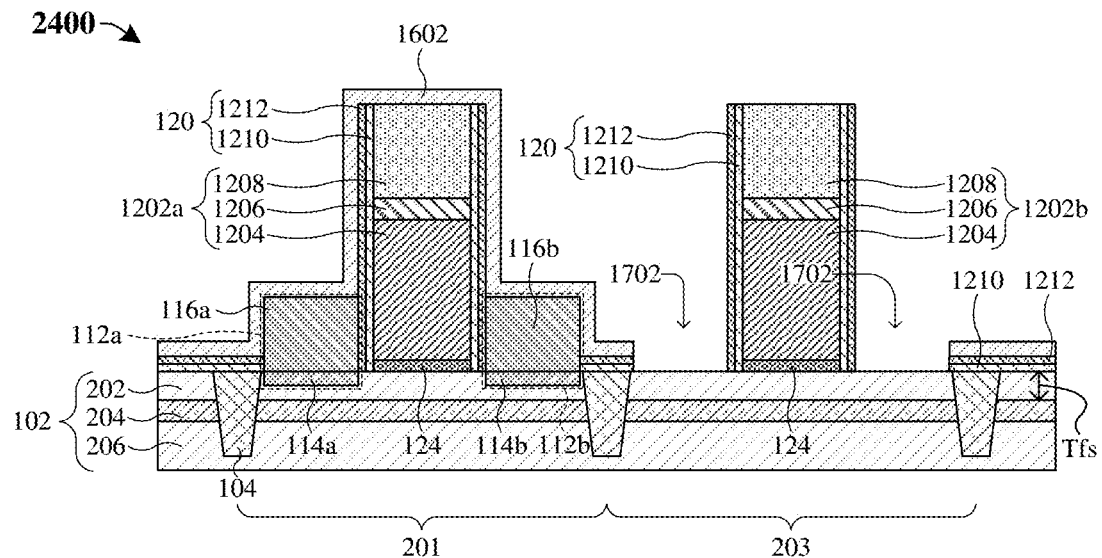
Figure 25:
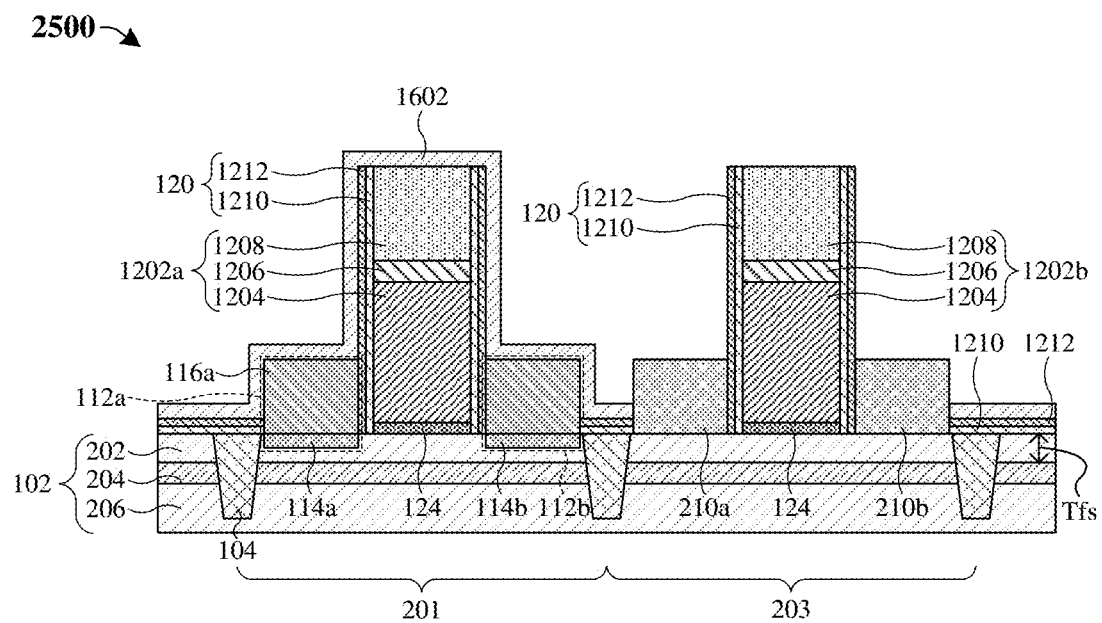

FIGS. 23-25 illustrate cross-sectional views 2300-2500 of some embodiments of a second method for forming an integrated chip comprising a first transistor and a second transistor disposed within/over a substrate, where the first transistor comprises diffusion barrier layers disposed between the substrate and epitaxial source/drain layers according to the present disclosure. In some embodiments, FIGS. 23-25 illustrate some embodiments of acts that may be performed in place of the acts at FIGS. 14-18 of the first method. Thus, the second method illustrates some alternative embodiments of the first method of FIGS. 11-22. For example, the second method may proceed from FIGS. 11-13 to FIGS. 23-25, and then from FIG. 25 to FIGS. 19-22 (i.e., skipping FIGS. 14-18). In such embodiments, the second method illustrates some alternative embodiments of forming the first pair of source/drain structures 112a-b.

As shown in cross-sectional view 2300 of FIG. 23, a doping process is performed on the first semiconductor material layer 202, thereby forming diffusion barrier layers 114a-b within the first semiconductor material layer 202. In such embodiments, the diffusion barrier layers 114a-b may be referred to as diffusion barrier regions. The doping process may for example, include exposing unmasked regions (e.g., using the first and second spacer layers 1210, 1212 as a masking layer during the doping process) of the first semiconductor material layer 202 to one or more dopants. In some embodiments, the one or more dopants may include the barrier dopant (e.g., carbon) and/or the first dopant (e.g., phosphorus, arsenic, or the like). In such embodiments, the diffusion barrier layer 114a-b may be configured as illustrated and/or described in FIG. 3A. In yet further embodiments, the diffusion barrier layers 114a-b are devoid of the first dopant (e.g., phosphorus and/or arsenic), such that the diffusion barrier layers 114 consist of or consist essentially of silicon and the barrier dopant (e.g., carbon), such as SiC. In addition, the one or more dopants may be disposed at an angle relative to a top surface of the first semiconductor material layer 202, where the angle is equal to or greater than 90 degrees.

In some embodiments, the diffusion barrier layers 114a-b are formed such that the diffusion barrier layers 114a-b each have a first doping concentration of the first dopant that is about $1.2*10^{20}$ atoms/cm$^3$, about $1.2*10^{21}$ atoms/cm$^3$, within a range of about $10^{19}$ to $4*10^{21}$ atoms/cm$^3$, or another suitable doping concentration value. In various embodiments, a first atomic percentage of the first dopant within each of the diffusion barrier layers 114a-b may be about 2 percent, within a range of about 0.2 to 8 percent, or another suitable percentage value. Further, the diffusion barrier layers 114a-b are formed such that the diffusion barrier layers 114a-b each have a second doping concentration of the barrier dopant that, for example, is about $5.2*10^{20}$ atoms/cm$^3$, within a range of about $10^{19}$ to $3*10^{21}$ atoms/cm$^3$, or another suitable doping concentration value. In various embodiments, a second atomic percentage of the barrier dopant within the diffusion barrier layers 114a-b may for example, be about 1 percent, within a range of about 0.2 to 6 percent, or another suitable percentage value.

In some embodiments, the doping process includes performing a single implantation process, where a concentration of the one or more dopants implanted into the first semiconductor material layer 202 is constant during the single implantation process. In such embodiments, a doping profile of carbon within the diffusion barrier layers 114a-b has a gaussian distribution (e.g., as illustrated and/or described in FIG. 9A). In an alternative embodiment, the doping process includes performing multiple implantation processes, wherein each implantation process may be configured to implant a different concentration of carbon within the diffusion barrier layers 114a-b. In such embodiments, a doping profile of carbon within the diffusion barrier layers 114a-b has a gradient distribution (e.g., as illustrated and/or described in FIG. 9B).

As shown in cross-sectional view 2400 of FIG. 24, a first pair of epitaxial source/drain layers 116a-b are formed over the diffusion barrier layer 114a-b, thereby forming a first pair of source/drain structures 112a-b. In some embodiments, the first pair of epitaxial source/drain layers 116a-b are formed as illustrated and/or described in FIG. 15. Further, as illustrated in FIG. 24, a masking layer 1602 is formed over the NMOS region 201, and a patterning process is performed on the first and second spacer layers 1210, 1212 according to the masking layer 1602, thereby forming second source/drain layer openings 1702 within the PMOS region 203. In some embodiments, the patterning process does not over etch into the first semiconductor material layer 202.

As shown in cross-sectional view 2500 of FIG. 25, a second pair of epitaxial source/drain layers 210a-b is formed over the first semiconductor material layer 202. In such embodiments, a bottom surface of the second pair of epitaxial source/drain layers 210a-b is disposed along a top surface of the first semiconductor material layer 202. In some embodiments, the second pair of epitaxial source/drain layers 210a-b are formed as illustrated and/or described in FIG. 18. Further, after forming the second pair of epitaxial source/drain layers 210a-b, one or more removal processes(es) is/are performed to remove the masking layer 1602, and/or the first and second spacer layers 1210, 1212 disposed along a top surface of the first semiconductor material layer 202 (not shown).

Figure 26:
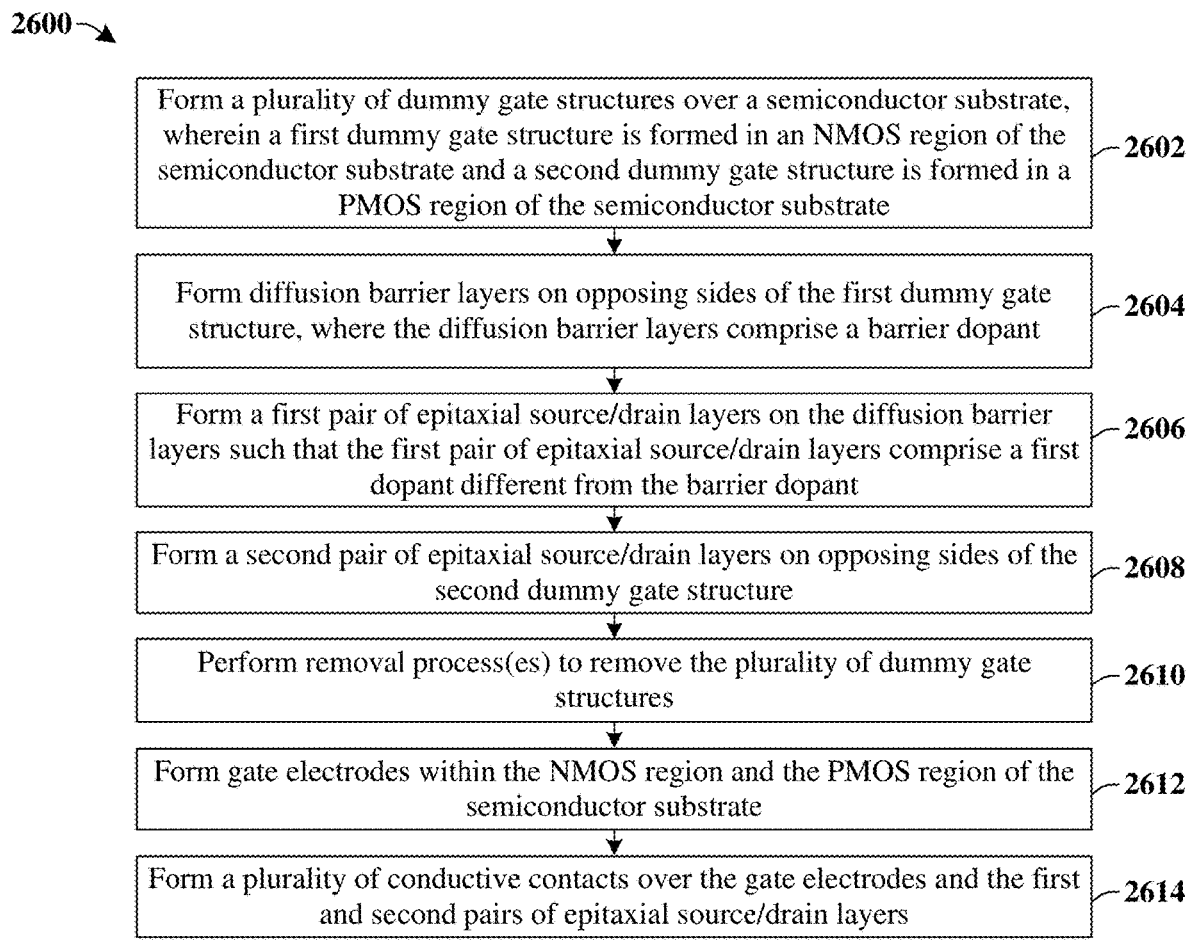
FIG. 26 illustrates a flowchart that illustrates some embodiments of a method for forming an integrated chip comprising a first transistor and a second transistor disposed within/over a substrate, where the first transistor comprises diffusion barrier layers disposed between the substrate and epitaxial source/drain layers.

FIG. 26 illustrates a method 2600 of forming an integrated chip comprising a first transistor and a second transistor disposed within/over a substrate, where the first transistor comprises diffusion barrier layers disposed between the substrate and epitaxial source/drain layers in accordance with some embodiments. Although the method 2600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts.

In some embodiments, some illustrated acts or events may be omitted, and other un-illustrated acts or events may be included.

At act 2602, a plurality of dummy gate structures are formed over a semiconductor substrate. A first dummy gate structure is formed in an NMOS region of the semiconductor substrate, and a second dummy gate structure is formed in a PMOS region of the semiconductor substrate. FIG. 12 illustrates the cross-sectional view 1200 corresponding to some embodiments of act 2602.

At act 2604, diffusion barrier layers are formed on opposing sides of the first dummy gate structure, where the diffusion barrier layers comprise a barrier dopant. FIGS. 13 and 14 illustrate cross-sectional views 1300 and 1400 corresponding to some embodiments of act 2604. Further, FIG. 23 illustrates the cross-sectional view 2300 corresponding to some alternative embodiments of act 2604.

At act 2606, a first pair of epitaxial source/drain layers are formed on the diffusion barrier layers such that the first pair of epitaxial source/drain layers comprise a first dopant different from the barrier dopant. FIG. 15 illustrates the cross-sectional view 1500 corresponding to some embodiments of act 2606. FIG. 24 illustrates the cross-sectional view 2400 corresponding to some alternative embodiments of act 2606.

At act 2608, a second pair of epitaxial source/drain layers are formed on opposing sides of the second dummy gate structure. FIGS. 17 and 18 illustrate cross-sectional views 1700 and 1800 corresponding to some embodiments of act 2608. FIGS. 24 and 25 illustrate cross-sectional views 2400 and 2500 corresponding to some alternative embodiments of act 2608.

At act 2610, removal process(es) is/are performed to remove the plurality of dummy gate structures. FIGS. 20 and 21 illustrate the cross-sectional views 2000 and 2100 corresponding to some embodiments of act 2610.

At act 2612, gate electrodes are formed within the NMOS region and PMOS region of the semiconductor substrate. FIGS. 20 and 21 illustrate the cross-sectional views 2000 and 2100 corresponding to some embodiments of act 2612.

At act 2614, a plurality of conductive contacts are formed over the gate electrodes and the first and second pairs of epitaxial source/drain layers. FIG. 22 illustrates the cross-sectional view 2200 corresponding to some embodiments of act 2612.

Accordingly, in some embodiments, the present application relates to a semiconductor structure comprising a diffusion barrier layer disposed between a semiconductor substrate and an epitaxial source/drain layer.

In some embodiments, the present application provides a semiconductor device including a gate electrode overlying a semiconductor substrate; an epitaxial source/drain layer disposed on the semiconductor substrate and laterally adjacent to the gate electrode, wherein the epitaxial source/drain layer comprises a first dopant; and a diffusion barrier layer between the epitaxial source/drain layer and the semiconductor substrate, wherein the diffusion barrier layer comprises a barrier dopant that is different from the first dopant. In an embodiments, the diffusion barrier layer is co-doped with the barrier dopant and the first dopant. In an embodiment, a doping concentration of the first dopant within the epitaxial source/drain layer is greater than a doping concentration of the first dopant within the diffusion barrier layer, wherein a doping concentration of the barrier dopant within the diffusion barrier layer is less than the doping concentration of the first dopant within the diffusion barrier layer. In an embodiment, the barrier dopant is configured to prevent diffusion of the first dopant from the epitaxial source/drain layer to a region of the semiconductor substrate directly underlying the gate electrode. In an embodiment, the diffusion barrier layer comprises epitaxial silicon, and a thickness of the epitaxial source/drain layer is greater than a thickness of the diffusion barrier layer. In an embodiment, a bottom surface of the diffusion barrier layer is disposed below a top surface of the semiconductor substrate, and wherein a bottom surface of the epitaxial source/drain layer is vertically above the top surface of the semiconductor substrate. In an embodiment, the diffusion barrier layer consists essentially of silicon, carbon, and phosphorus (SiCP), and the epitaxial source/drain layer consists essentially of silicon and phosphorus (SiP). In an embodiment, the diffusion barrier layer consists essentially of silicon, carbon, and arsenic (SiCAs), and the epitaxial source/drain layer consists essentially of silicon and arsenic (SiAs). In an embodiment, the diffusion barrier layer is a doped region of the semiconductor substrate extending from a top surface of the semiconductor substrate to a point below the top surface of the semiconductor substrate, wherein the epitaxial source/drain layer is disposed along a top surface of the diffusion barrier layer.

In some embodiments, the present application provides an integrated chip including a semiconductor-on-insulator (SOI) substrate including a first semiconductor layer, a second semiconductor layer, and an insulating layer disposed between the first and second semiconductor layers; an N-type metal oxide semiconductor (NMOS) transistor disposed over the first semiconductor layer, wherein the NMOS transistor comprises a gate electrode, a gate dielectric layer disposed between the gate electrode and the first semiconductor layer, and a pair of source/drain structures disposed on opposing sides of the gate electrode, wherein the pair of source/drain structures includes a first pair of epitaxial source/drain layers over the first semiconductor layer, wherein the first pair of source/drain epitaxial layers comprise a first N-type dopant; and diffusion barrier layers disposed between the first semiconductor layer and the first pair of source/drain epitaxial layers, wherein the diffusion barrier layers comprise a barrier dopant that is different from the first N-type dopant. In an embodiment, the diffusion barrier layers comprise a first atomic percentage of the first N-type dopant and a second atomic percentage of the barrier dopant, wherein the first atomic percentage is greater than the second atomic percentage. In an embodiment, the diffusion barrier layers are epitaxial layers co-doped with a second N-type dopant and the barrier dopant, wherein the first N-type dopant is different from the second N-type dopant. In an embodiment, the first N-type dopant comprises phosphorous and the second N-type dopant comprises arsenic. In an embodiment, the integrated chip further includes a P-type metal oxide semiconductor (PMOS) transistor disposed over the first semiconductor layer and laterally adjacent to the NMOS transistor, wherein the PMOS transistor comprises a second gate electrode, a second gate dielectric layer underlying the second gate electrode, and a second pair of epitaxial source/drain layers disposed on opposing sides of the second gate electrode, wherein a bottom surface of the second pair of epitaxial source/drain layers is aligned with a bottom surface of the diffusion barrier layers. In an embodiment, the first pair of source/drain epitaxial layers and the diffusion barrier layers have a trapezoidal shape. In an embodiment, the diffusion barrier layers are doped regions of the first semiconductor layer such that the diffusion barrier layers extend continuously from a top surface of the first semiconductor layer to a top surface of the insulating layer.

In some embodiments, the present application provides a method for manufacturing an integrated chip, including forming a gate electrode structure over a semiconductor substrate; forming a diffusion barrier layer over the semiconductor substrate and laterally adjacent to the gate electrode structure, wherein the diffusion barrier layer comprises a barrier dopant; and forming an epitaxial source/drain layer over the diffusion barrier layer such that the epitaxial source/drain layer comprises a first dopant different from the barrier dopant, wherein the diffusion barrier layer is between the epitaxial source/drain layer and the semiconductor substrate. In an embodiment, forming the diffusion barrier layer includes forming a masking layer over the semiconductor substrate, wherein the masking layer comprises a plurality of sidewalls defining source/drain region opening over the semiconductor substrate; and performing a selective epitaxial growth process to selectively form the diffusion barrier layer within the source/drain region opening, wherein the selective epitaxial growth process includes in-situ doping the diffusion barrier layer with the first dopant and the barrier dopant. In an embodiment, the diffusion barrier layer is formed such that a doping profile of the barrier dopant within the diffusion barrier layer has a gaussian distribution. In an embodiment, forming the epitaxial source/drain layer includes performing a selective epitaxial growth process to selectively form the epitaxial source/drain layer along a top surface of the diffusion barrier layer, wherein a bottom surface of the epitaxial source/drain layer is vertically above a top surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
  a semiconductor substrate; and
  a first transistor on the semiconductor substrate and comprising a first gate structure over the semiconductor substrate, a first pair of source/drain regions on opposing sides of the first gate structure, and a pair of diffusion barrier structures between the first pair of source/drain regions and a lower region of the semiconductor substrate, wherein the first pair of source/drain regions comprise a first dopant, wherein the diffusion barrier structures are co-doped with the first dopant and a second dopant different from the first dopant, wherein a doping concentration of the first dopant within the first pair of source/drain regions is greater than a doping concentration of the first dopant within the diffusion barrier structures, wherein a doping concentration of the second dopant in the diffusion barrier structures continuously changes from upper surfaces of the diffusion barrier structures in a direction away from the first pair of source/drain regions.

2. The integrated chip of claim 1, wherein the doping concentration of the second dopant within the diffusion barrier structures is less than the doping concentration of the first dopant within the diffusion barrier structures.

3. The integrated chip of claim 1, further comprising:
  a second transistor on the semiconductor substrate and laterally adjacent to the first transistor, wherein the second transistor comprises a second gate structure over the semiconductor substrate and a second pair of source/drain regions disposed on opposing sides of the second gate structure, wherein a bottom surface of the second pair of source/drain regions is below a bottom surface of the first pair of source/drain regions.

4. The integrated chip of claim 3, wherein the first transistor is configured as an N-type transistor and the second transistor is configured as a P-type transistor.

5. The integrated chip of claim 3, wherein the bottom surface of the second pair of source/drain regions is substantially coplanar with a bottom surface of the pair of diffusion barrier structures.

6. The integrated chip of claim 3, wherein a height of the second pair of source/drain regions is greater than a height of the first pair of source/drain regions.

7. The integrated chip of claim 1, wherein in a cross-sectional view the first pair of source/drain regions have a first shape and the diffusion barrier structures have a second shape different from the first shape.

8. The integrated chip of claim 1, wherein the first gate structure comprises a gate electrode and a gate dielectric layer between the gate electrode and the semiconductor substrate, wherein a thickness of the pair of diffusion barrier structures is greater than a thickness of the gate dielectric layer.

9. The integrated chip of claim 1, wherein the first dopant is an N-type dopant and the second dopant is carbon.

10. An integrated chip, comprising:
  a fin structure extending vertically from a base region of a semiconductor substrate;
  a gate electrode over the fin structure;
  an epitaxial source/drain layer disposed over an upper surface of the semiconductor substrate and adjacent to the fin structure, wherein the epitaxial source/drain layer comprises a first dopant; and
  a diffusion barrier layer between the epitaxial source/drain layer and the fin structure, wherein the diffusion barrier layer extends along the upper surface of the semiconductor substrate, wherein the diffusion barrier layer is co-doped with a second dopant and a third dopant, wherein the third dopant is different from the first and second dopants, wherein a top surface of the diffusion barrier layer is vertically above a top surface of the fin structure.

11. The integrated chip of claim 10, wherein the diffusion barrier layer extends along a sidewall of the fin structure and a lower surface of the epitaxial source/drain layer.

12. The integrated chip of claim 10, wherein a plurality of nanostructures overlie the fin structure, wherein the diffusion barrier layer extends along a sidewall of each nanostructure in the plurality of nanostructures.

13. The integrated chip of claim 10, wherein a height of the diffusion barrier layer is greater than a height of the fin structure.

14. The integrated chip of claim 10, wherein the top surface of the diffusion barrier layer is substantially coplanar with a top surface of the epitaxial source/drain layer.

15. The integrated chip of claim 10, wherein the second dopant and the first dopant are each an N-type dopant.

16. An integrated chip, comprising:
a semiconductor substrate;
a first transistor on the semiconductor substrate and comprising a first gate structure over the semiconductor substrate, a pair of first source/drain regions on opposing sides of the first gate structure, and a pair of diffusion barrier structures between the pair of first source/drain regions and a lower region of the semiconductor substrate, wherein the pair of first source/drain regions comprise a first dopant having a first doping type, wherein the diffusion barrier structures contact and vertically separate bottommost surfaces of the first source/drain regions from the lower region by a non-zero distance; and
a second transistor on the semiconductor substrate and laterally adjacent to the first transistor, wherein the second transistor comprises a second gate structure over the semiconductor substrate and a pair of second source/drain regions disposed on opposing sides of the second gate structure, wherein the pair of second source/drain regions contact the semiconductor substrate and have a second doping type opposite the first doping type.

17. The integrated chip of claim 16, wherein the pair of first source/drain regions and the pair of diffusion barrier layers comprise a first material, and the pair of second source/drain regions comprise a second material different from the first material.

18. The integrated chip of claim 16, wherein a first thickness of the pair of first source/drain regions is less than a second thickness of the pair of second source/drain regions and is greater than a third thickness of the pair of diffusion barrier structures.

19. The integrated chip of claim 16, wherein the lower region of the semiconductor substrate contacts bottoms of the diffusion barrier structures and has the second doping type.

20. The integrated chip of claim 16, wherein the lower region of the semiconductor substrate is undoped or comprises the second doping type.

* * * * *